United States Patent
Wood

(10) Patent No.: US 7,203,914 B2
(45) Date of Patent: Apr. 10, 2007

(54) TIMING CIRCUIT CAD

(75) Inventor: John Wood, Santa Cruz, CA (US)

(73) Assignee: MultiGIG Ltd. (GB)

( * ) Notice: Subject to any disclaimer, the term of this patent is extended or adjusted under 35 U.S.C. 154(b) by 187 days.

(21) Appl. No.: 10/497,730

(22) PCT Filed: Dec. 6, 2002

(86) PCT No.: PCT/GB02/05514

§ 371 (c)(1),
(2), (4) Date: Jun. 4, 2004

(87) PCT Pub. No.: WO03/048979

PCT Pub. Date: Jun. 12, 2003

(65) Prior Publication Data

US 2005/0010883 A1    Jan. 13, 2005

(30) Foreign Application Priority Data

Dec. 7, 2001  (GB) ................................. 0129352.1
Jun. 6, 2002  (GB) ................................. 0212869.2

(51) Int. Cl.
*G06F 17/50* (2006.01)
(52) U.S. Cl. ...................... 716/4; 716/5; 716/6; 716/8; 716/10
(58) Field of Classification Search .............. 716/4–12, 716/18, 1
See application file for complete search history.

(56) References Cited

U.S. PATENT DOCUMENTS 6,460,165 B1 * 10/2002 Ismail et al. .................... 716/1
2003/0131329 A1 * 7/2003 Gonzalez ........................ 716/6

(Continued)

FOREIGN PATENT DOCUMENTS

GB       2349524       11/2000

OTHER PUBLICATIONS

International Search Report; ref: PCT/GB02/05514, Jan. 29, 2004.

(Continued)

*Primary Examiner*—Paul Dinh
(74) *Attorney, Agent, or Firm*—Anthony B. Diepenbrock, III; Dechert LLP

(57) ABSTRACT

A method of generating a design for timing circuitry having plural rotary travelling wave component circuit sections, comprises the steps of first dividing an area to be serviced into regions each small enough for there to be negligible inter-region transmission-line delay at target operating frequency. The dividing perimeters of each said region are then divided into segments suitable for approximating lumped transmission-line LKR and relevant parameters determined so that time delays over each such segment are substantially equal to cycle time of desired frequency divided by twice the number of segments. The capacitance of each segment is determined to be substantially equal to the largest envisaged load capacitance (including or preferably differential load capacitance) plus loop-to-loop interconnect capacitance plus active device (say and usually transistor) capacitance of voltage-transition regenerative means and addition to unloaded segments of padding capacitance calculated substantially to match the lumped line capacitance, and pitch/width of differencial transmission-line conductors is calculated using Wheeler's formula constrained by metallization factor involved. Finally a suitable odd number of crossovers of transmission-line conductors is ascertained to meet cross-talk desiderata and number of transmission line loops specified to cover the area to be serviced and their interconnections, say conveniently at corners of rectangular said regions; and account taken of up to all of interconnect inductance, conduction skin effects, cross-talk, and MOSFET parasitics at least for high frequency applications.

6 Claims, 15 Drawing Sheets

OTHER PUBLICATIONS

Wood, John. et al., "Rotary traveling-wave oscillator arrays: a new clock technology," IEEE Journal of Solid-State Circuits, Nov. 2001, vol. 36, No. 11, pp. 1654-1665.

MultiGiG ltd: Rotary Explorer Vo. 5 User's Guide, 'online! Apr. 28, 2001, pp. 1-33.

* cited by examiner

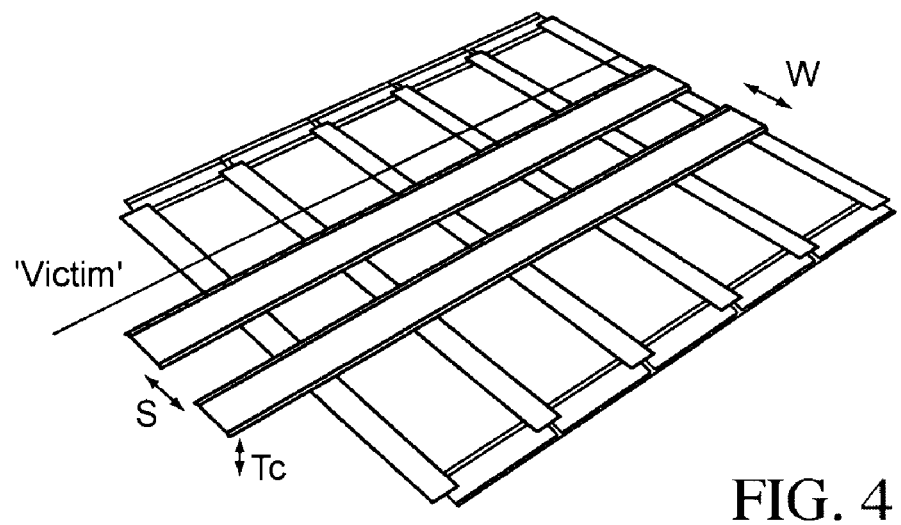
FIG. 4
FIG. 5
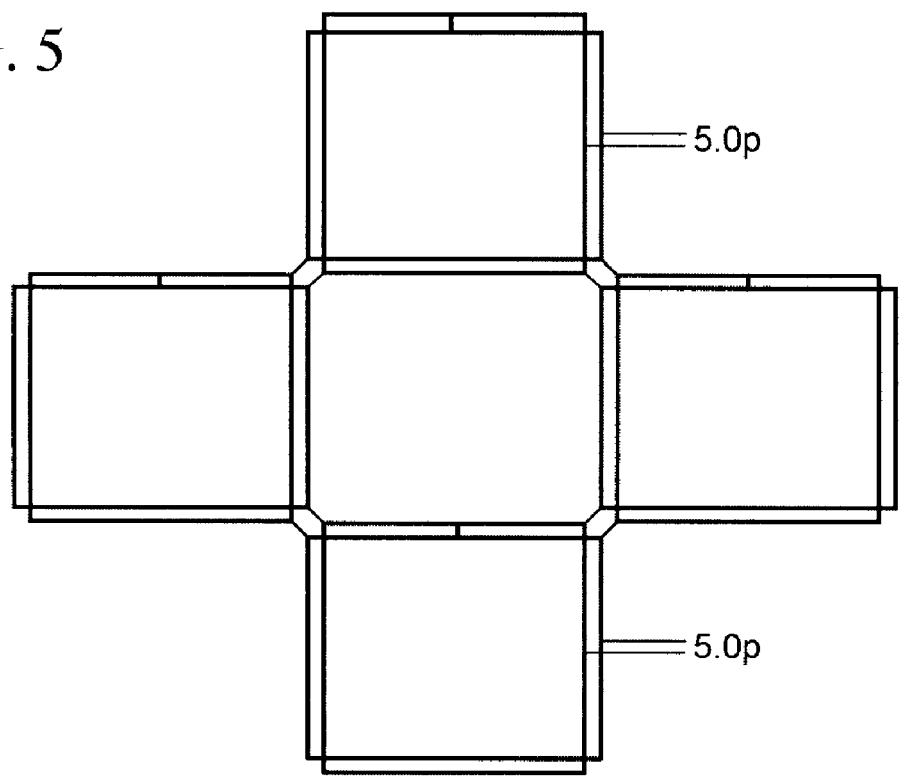

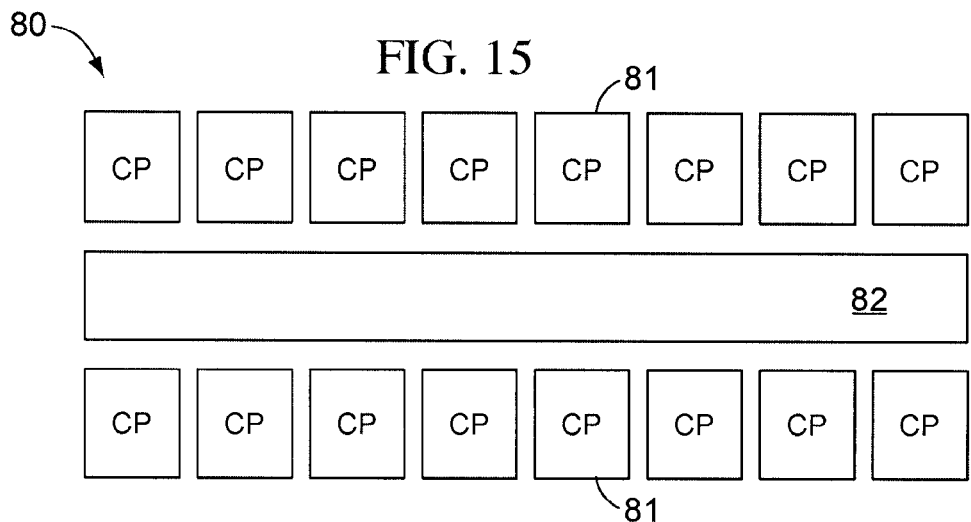
FIG. 15
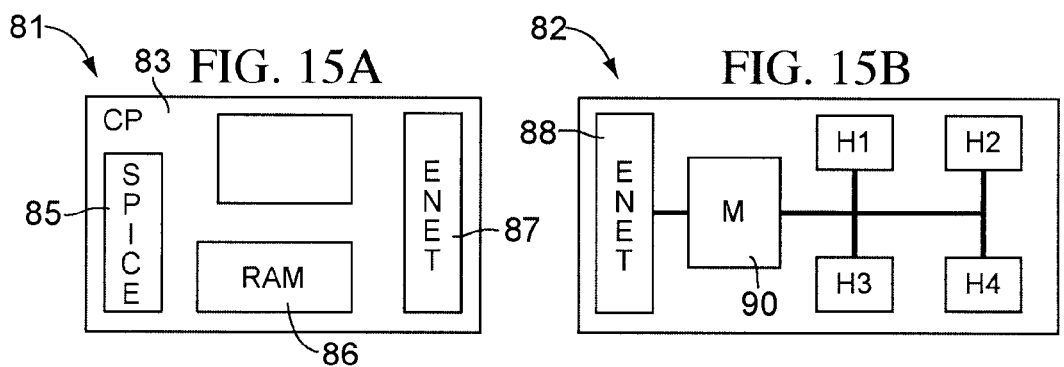
FIG. 15A
FIG. 15B
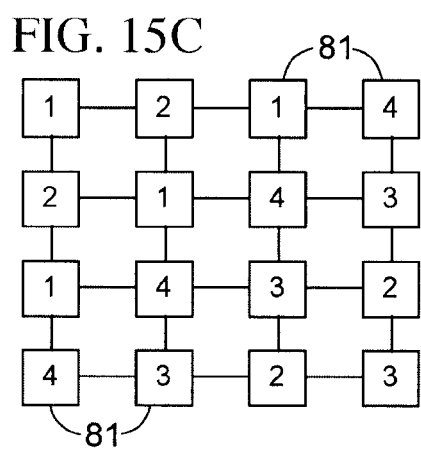
FIG. 15C
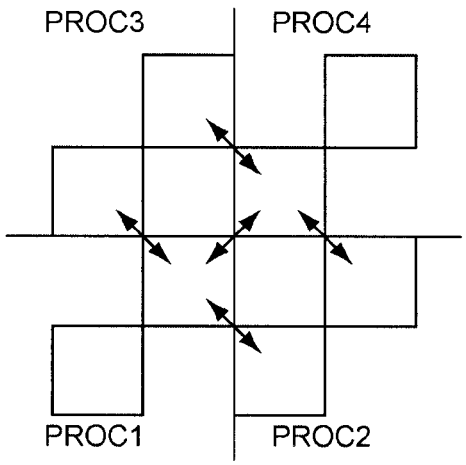
FIG. 15D
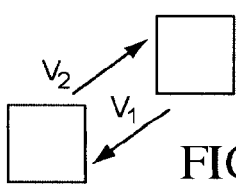
FIG. 15E

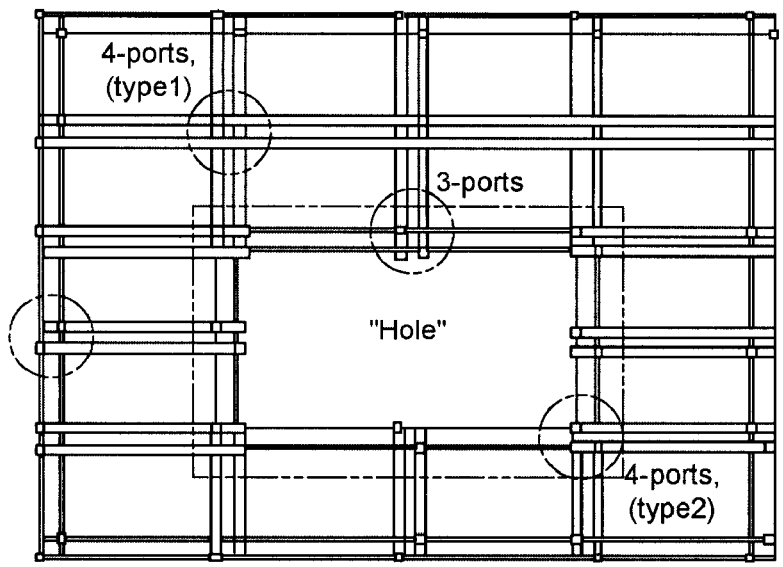
FIG. 23
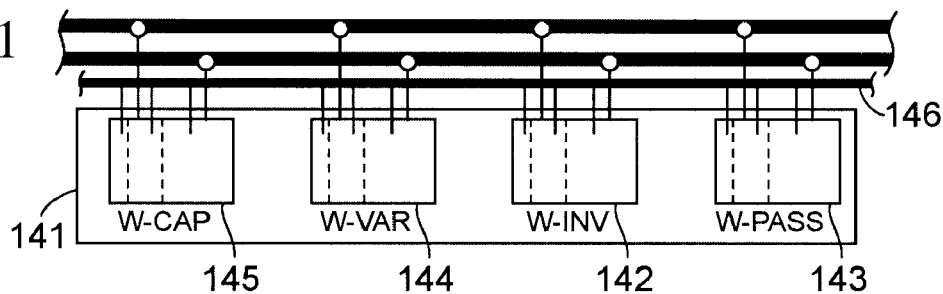
FIG. 21
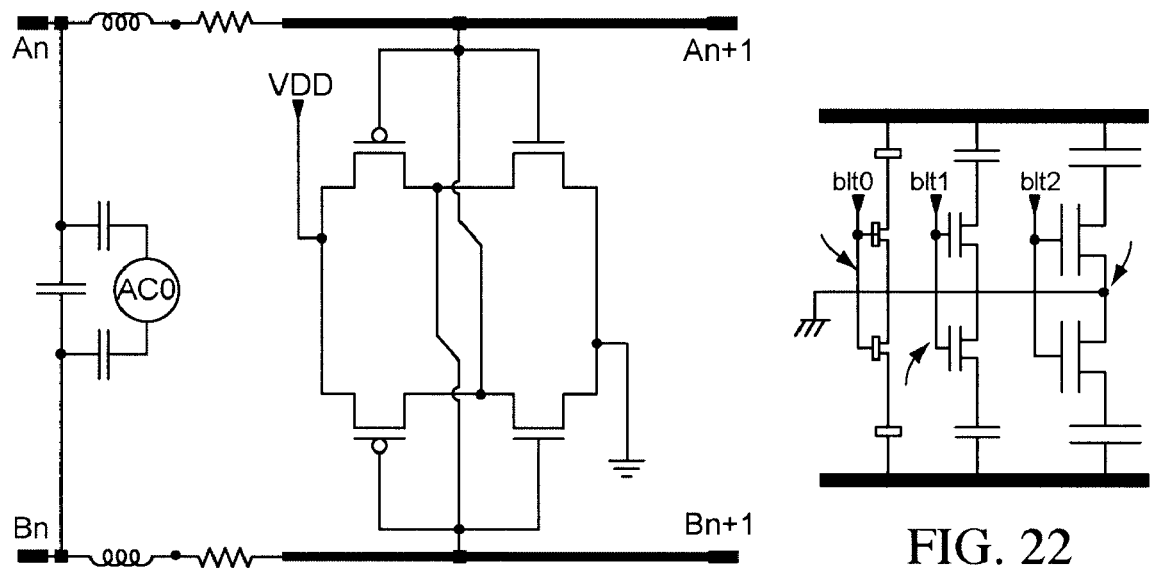
FIG. 20
FIG. 22

TIMING CIRCUIT CAD

This invention relates to computer-aided design (CAD) for lay-out of circuitry for implementing timing of a travelling wave nature and has application, inter alia, to semiconductor integrated circuits (ICs or "chips"), including for very large scale (VLSI) circuits; and to methods, systems, devices and apparatus arising therefrom and/or by association therewith.

Design and layout of conventional clock-trees, perhaps particularly of H-tree type, for timing or clock signal distribution by CAD gets ever more difficult and problematic with increases in operating clock frequencies or speeds and in circuitry content, including clock signal buffering, refreshing and servo-type control as by phase-lock loops, and complexity of functional circuitry to be served; all compounded by increases in capability of fabrication technology further to reduce individual feature sizes.

It is understood that large H-tree type clock signal distribution lay-outs often require a great deal of detail work after even the most expensive of specialist CAD software has produced the best start-point it can. Indeed, the tendency seems now to be increasingly towards splitting VLSI circuitry into time domains or zones within which clock-tree lay-out design should be more manageable. It is, however, further understood that there is a significant incidence of intractabilities, including such as 25 mis-allocations to such domains, that can cause back-tracking circuit design all the way to basic floor-plan levels.

Having different clocking domains or zones has led to different parts of VLSI circuits having different operating clock speeds. This also seems to have led to VLSI circuits being "rated" by the speed of the fastest clock onboard the chip concerned, though often for only a small part of its total functional circuitry. Whilst there are must be circumstances in which VLSI circuits get overall benefit from particular functions running faster than the rest of the chip, it is self-evident that this cannot be anything like as advantageous and efficient as having the whole circuit capable of the fastest clock speed, i.e. avoiding effectively wasting clock cycles for data transfer between time domains or zones and/or more generally for data-in and data-out provisions.

UK patent number 2 349 524 (deriving from PCT application GB00/00175) relates to timing systems that are radically different from historical signal generation with output distributed by such as H-tree lay-outs. Specifically, this patent teaches timing circuitry in which signal generation and distribution are effectively integrated by way of plural rotary travelling wave (RTW) component circuits gridded together in a rotation- and phase-locked array with simultaneous production of timing waveforms at each component circuit and reliably available therefrom in any desired phase or phases.

Suitable such path is of a transmission-line nature and comprises a pair of parallel conductors with a cross-over after the manner of a Moebius loop, though the cross-over can be replaced by transformer action. The voltage transition can be fast as controlled by regenerative mans distributed along the path, typically of active device usually transistor form, say back-to-back parallel pairs of opposed inverters; and a highly square bipolar wave-form can be produced with each half-cycle corresponding to the traverse time of the path. Such wave-form and its inverse is always available at any desired phase angle according to positions along said path of signal take-offs, typically for timing purposes. Any number of such loop paths, often a very large number for such as very fast (GHZ and much higher speed) VLSI chips, can be "gridded" together in arrays, say connected corner-to-corner for convenient at least nominally rectangular loop geometries (though shape is not functionally significant), to present stable low-power clocking over much larger areas than that each path loop (which will of course, naturally reduce with speed). We refer to such circuitry as Rotary Travelling Wave Oscillator (RTWO), and more information is available in the above patent applications, also in the paper "Rotary Traveling-Wave Oscillator Arrays: A New Clock Technology" in IEEE Journal of Solid-State Circuits, vol. 36, no. 11 (November 2001).

In such array of rotary circuit components, whilst the term "distribution" is used, it is found to be helpful to consider such an array in terms of providing simultaneous availability of reliably similar signals in each and every component circuit The duration of each timing signal pulse, typically one half-cycle of a bipolar wave-form inherently present differentially, is the traverse time for a signal transition round endless electromagnetically continuous signal paths that by their nature impose a nett signal inversion; and the leading (rising) and trailing (falling) edges of those timing pulses are represented by the signal transition and its nett inversion through two traversals of the endless signal paths; the signal transition being refreshed as frequently as desired within such path recirculations, both as to amplitude and steepness so that power requirements are lowered by energy supply being simply related to a "top-up" requirements of the signal transition and having no requirement for absorption of timing signal energy in the terminations that need such careful detail design in clock-tree type distributions.

As is to be expected, design and lay-out of such integrated generation and distribution perhaps more accurately simultaneous availability) of travelling-wave type timing signal waveforms is inevitably different from H-tree clock distribution design and lay-out. This has been put forward as needing solution if possible less problematic than for H-trees.

It is an object of this invention to demonstrate practicality of CAD lay-out for rotary travelling wave arrays, including use of and compatibility with industry standard simulation, typically involving the well known Spice software.

According to general aspects of this invention, viable such CAD layout involves methodology based on predictive calculation fist, followed by simulation, then correctional adjustments with at least partial re-calculation(s) and re-simulation(s) to refine the predicted layout; and this is done in one general aspect with inductance taken into particular account, typically utilising a suitable available computer program for its extraction; and in another general aspect relative to attaining better or best results for at least one design parameter or desideratum, say as to minimising power consumption, and/or keeping to or below a settable target, as can be particularly advantageous.

Accordingly, various aspects of this invention arise in and from employing one or more of the following method and/or software steps dividing area to be serviced into regions each small enough for there to be negligible inter-region transmission-line delay at target operating frequency, such regions conveniently being rectangular dividing perimeters of each such region into segments suitable for approximating lumped transmission-line LCR, typically at least eight such segments, preferably of a rectangular perimeter determining relevant parameters so that time delays over each such segment are substantially equal to cycle time of desired frequency divided by twice the number of segments determining capacitance of each segment to be substantially equal to the largest envisaged load capacitance (including or preferably differential load capacitance) plus loop-to-loop interconnect capacitance plus active device (say and usually transistor) capacitance of voltage-transmission regenerative means determining addition to unloaded segments of padding capacitance substantially to match the lumped line capacitance determining inductance for each segment from the lumped line capacitance determining pitch/width of differential transmission-line conductors using Wheeler's formula constrained by metallization factor involved determining suitable odd number of crossovers of transmission-line conductors to meet cross-talk desiderata specifying number of transmission line loops to cover the area to be serviced and their interconnections, say conveniently at corners of rectangular said regions taking account of up to all of interconnect inductance, conduction skin effects, crosstalk, and MOSFET parasitics at least for high frequency applications.

Preferred application of design tool methodology software in implementing and embodying this invention is by way of response, preferably automatic response, to input in the form of a desired waveform frequency by generation of a suitable design lay-out, and such constitutes another aspect of this invention, preferably along with compensation for any loading according to input(s) as to location and size.

Such processing involves solving transmission-line equations for each section of the array network, preferably so as to maintain impedance and phase coherence by value(s) and position(s) of added padding capacitances and/or by selection of transmission-line geometry. The resulting lay-out can advantageously be displayed, say on a vdu screen of computer equipment software controlled as herein, preferably complete with showing stimulation of stable and reliable waveform.

In terms of practicality, and compared with industry-standard simulation and re-simulation, this methodology is advantageous for CAD implementation hereof as rotary travelling wave (RTW) timing is found to be well-suited to predictive calculation that is quicker to perform than industry-standard simulation, though such simulation is more accurate than calculation; and correctional adjustment and recalculation hereof with re-simulation readily produces convergence to viability satisfying layouts.

Moreover, at least one simulation may be other than of industry-standard type and quicker as RTW timing is also found to lend itself usefully to much quicker simulation hereof before use of industry-standard simulation thus saving time.

For any overall IC design, or for parts of it if so desired, there will be design parameters and desiderata that are known or are reasonably estimable relative to timing signal requirements, e.g. target operating frequency or clock speed/rate and timing pulse rise/fall times, and loads to be timed as to their number and supply voltage requirements (which could be different for input/output and for logic); together with any relative physical location and proximity requirements of the loads, and their electrical characteristics including capacitive loading they represent, and their tolerance to phase skew; also the intended implementing technology typically including as to feature sizing, metallisation, and transistor characteristics. At least ranges can usually readily be produced for such parameters, characteristics and desiderata, even at quite early design stages, and this invention is applicable as much to early indication of viability as to later detailing of layout. This stage is part of what is hereinafter referred to as "specify", and it is helpful to have this in a working screen display that may further include at least some selected items from the next paragraph.

There will be implementation parameters that will follow from the target technology, often further from the particular foundry to be used. There may be ranges to some of these, but others will be fixed, e.g. as to maximum operating voltage, conductor type (usually copper or aluminium) and thickness, maximum conductor current density, interconnects, and relating to available passive formations such as resistors and capacitors and active formations such as transistors.

Parameters and characteristics related to the RTW component circuits and their interconnection into an array are also readily quantifiable, including from what is in our aforementioned UK patent and also in the paper published in Vol 36, No. 11 (November 2001) of IEEE Journal of Solid State Circuits, the contents of which are to be taken as fully imported herein. These RTW component circuits are specifically envisaged with their travelling wave supporting transmission-line endless signal paths implemented using two essentially parallel conductive traces with a nett inversion effect.

Such effect is available from a "cross-over" between such trace conductors, or an odd number of cross-overs. Whilst there is no inherent dictation of shape(s) for such signal path(s), their localised interconnects in forming a simultaneously operating synchronised array have led rationally to same being at corners of substantially rectangular RTW component circuits with "virtual" such circuits apparent and effective in "holes" between actual such circuits.

Alternative operative areal geometries that are also very versatile are taught herein and form a specific inventive aspect hereof specifically, substantially rectangular geometries involving using layers of metallisation in orthogonal row-and 30 column fashion, one layer for row-following conductors, and the other for column following conductors, have vias at intersections for interconnects to secure the requisite Moebius twist configuration, thus the signal inversion. The rectangular aspect ratio can be chosen to make greater use, thus occupation, of one metallisation layer than the other, which can be advantageous as many other logic etc connects must be made. Specific implementation of the present invention will be described relative to such inventive geometry, but that is not to be taken as limiting. It is a matter of choice and convenience to adopt a particular geometry, including as to applying the same geometry to all such arrayed RTW component circuits.

Further constraint(s) may be applied, typically as to permissible widths and spacings of dual parallel conductor traces, and how much of a particular metallisation layer can be devoted to timing signal usage. Whilst, in principle, it is immaterial as to whether this or other constraints is treated as part of the "specify" stage, in practice it is advantageous to have this available on a "constain" screen that might also usefully include or repeat access to some of the "specify" data, at least as data that might be changed independently of other "specify" data, say for ready adjustment purposes at least after simulation, but with general convenience of availability. The balance and/or overlap between "specify" and "constrain" screens is a matter of choice. These specified parameters/characteristics and constraints etc constitute a contextual database within which CAD layout design aspects and embodiments of this invention operate.

An important factor to note and emphasise is that reduction of feature sizes in fabrication of ICs and high operating frequencies or clock speeds work together in increasing the impact of inductance, and this is taken into account in a general aspect of implementing this invention. In pursuit of an alternative to quite slow processing using the well known FastHenry inductance extraction program for simulating inductance between the component rotary travelling wave circuits and IC signal conductors, a useful approximating routine has been developed.

This routine is seen as a specific aspect of this invention and is based on use of two-dimensional gridding of area about a component circuit conductor and calculation of mutual inductance per unit length, say for a no-thickness wire in the X and Y co-ordinate directions at each grid point, more accurately plural such wires in parallel; and integrating along a general wire in the same space for an approximation to mutual inductance that is typically within 15% of using FastHenry, and very much faster to do as a useful measure of likelihood of viability without specifying or constraining significant changes.

It is preferred herein to select a signal paths geometry that is helpful to implementing this CAD layout design invention, and regular geometry does assist in this way. Once such a regular geometry is decided, whether as a convenient standard or chosen from a repertoire thereof, and its parameters/characteristics are, known along with those of the IC implementation concerned, including as to transistors etc of regenerative cross-connections at intervals along the dual conductive traces of each RTW component circuits, a length for the signal paths is readily calculable as a function of the target frequency.

From such length and where such RTW signal paths serve sub-areas of the chip that are contiguous, or effectively so, a prediction for a corresponding number of RTW component circuits can be a simple function of such sub-areas related to the calculated signal path lengths and the total operative area to be serviced for the IC concerned. For regular substantially rectangular signal path geometries with their sides adjacent as in the above-mentioned cofiled application, their included area is a function of their aspect ratio, and the predicted requisite number of RTW component circuits follows most readily from the lengths of their sides. Ready derivation of such predicted number of RTW component circuits can also be in accordance with side lengths for corner-connected actual and virtual RTW component circuits, but see more later regarding clustering.

Such predicted number of RTW component circuits need not be treated as an absolute, as geometry alone can change it in relation to a nominal signal path length, and changing electrical parameters can affect nominal path length.

Alongside "specify" and/or "constrain" stages, routines are provided for the loads to be grouped or clustered, and then to be routed to connect with the RTW component circuits. These routines are seen as specific inventive aspects hereof Clustering is needed because there will usually be a much larger number of individual loads to be supplied with timing signals than there are RTW component circuits. This might be seen as problematic in the context of the industry norm of aiming for synchronous application of timing signals, and each RTW component circuit inherently having only one position along its path from which to obtain any exact particular phase. However, provisions can be made for single timing signal take-off positions from each RTW component circuit to feed into branches or small networks for multiple connections to plural loads.

Moreover, routing of connects for the loads is aided by appreciation that loads as functional circuitry of ICs generally have a tolerance to skew, i.e. the extent to which a timing signal can be off its exact nominal phase and still work correctly. This tolerance translates into a length along the signal path, i.e. the conductor traces, of the RTW component circuit concerned. Given that a full cycle of the travelling wave in such signal path requires two signal transition traversals of the path (one traversal corresponding to one polarity of pulse in preferred bipolar waveforms), a skew tolerance of up to 10% (which is not unusual) allows up to 20% of the signal path to be used for timing signal takeoffs without loss of nominally synchronous operation. At least when combined with use of small networks, this generally this gives a possible take-offs multiplier that is more than adequate to service the loads of even ICs with a very large number of loads to receive timing signals, such as a microprocessor, and to keep take-off connections short enough to avoid "ringing" reflections during the rise time (thus avoid need for provision of buffers), which is readily calculable as an RTW component circuit feature, say typically less than about 0.5 millimetre for 2 GHz clocking, and less for higher clock rates.

Furthermore, the resulting potentially highly asymmetric loading of the signal paths of the RTW component circuits is readily compensated by specifying dummy or padding capacitances applied elsewhere round each such signal path concerned, and this may also form part of preferred clustering routines, i.e. after load allocation to the RTW component circuits thus capacitive loading known. This is also seen as a specific inventive aspect, including as may be done on an earlier predictive calculation basis from mean or maximum loading per RTW component circuit and assuming whatever dummy or padding capacitance corresponds per side-length thereof then deduction (maybe addition relative to mean) for each actual load assigned, or as may be done by use of physically in-built and specifiable capacitance provisions at each said side then duly specifying according to assigned loads so as to achieve either of substantially uniform impedance loading all round each RTW component circuits endless signal path or a viable progression of such impedance loading, i.e. that maintains desired signal fidelity at least where take-off connects are required.

It is, of course; the case that any move away from the fully synchronous paradigm towards multi-phase operation or even progressive phasing of operation of functional circuitry, say following the order of functions performed, would be very readily accommodated by RTW clocking.

A clustering routine, as a specific inventive aspect hereof can be based on what loading can be driven by each RTW component circuit, say as an average therefor with a reasonable safety margin built-in relative to any maxima, which also aids achieving a reasonably even spread of loads capacitance between the RTW component circuits as is beneficial to overall operation. Thus, preferred clustering routines may operate by a first decision as to the number of clusters, say on the basis that there should be more than the result of dividing the total for all capacitive loads (which should be available for any proposed IC at least on a not-more-than basis) by the maximum loads capacitance to be allowed for each cluster (which will be available as a feature of the rotary travelling wave component circuits). A first assignment of loads to clusters could be simply as one per RTW component circuit available, and can take account of what is known for each load about requirements for physical location on the IC chip and its skew tolerance, otherwise aimed at reasonably even spread of capacitance amongst/between the clusters. However, exemplary clustering routines hereof (as will shown and described) can be free of criticality regarding first assignment, i.e. will sort out to practical assigning as they progress.

Thus first assignment can be processed cluster-by-cluster to determine their centroids in terms of capacitance weighted averaging of X-Y coordinates and phase tolerances of loads in a cluster relative to the total capacitance of that cluster, then processed load-by-load to calculate distances to each cluster centroid and, if and as appropriate, shift any load to the cluster having the nearest of any nearer centroids. At each such shift, the centroids of the clusters concerned will be recalculated, and these steps iterated until either no loads are moved or a pre-set maximum is reached for iterations. Using known distance functions, such routine has proved successful for 40,000 loads and 100 clusters on a Pentium 600 MHz computer, and it is feasible to split larger numbers of loads (and clusters) into sectors grouped by physical location criteria.

Preferably, and advantageously such clustering takes account of an average for load capacitance as clustered in order to even out the loading of the clusters at least to some useful effect.

Inventive routing routines hereof take the results of clustering to the RTW component circuits and can take further account of skew tolerances of the loads to plot actual connects within the available "skew tolerance" length of the RTW signal paths concerned, whether directly or via networks to suit the skew tolerances. Given that industry-standard Spice-based simulations of entire arrays hereof must inevitably be slow, another specific inventive aspect hereof is directed to a routine for more easily and quickly first checking/verification of proposed RTW timing signal arrays. Highly advantageously, this leads to similarly quick and easy remedial measures for arrays that are unsatisfactory at such first checking, or can be significantly improved; and constitutes a stage herein called "solve".

Our above-mentioned UK patent put forward a rule for each junction to in and between component circuits in RTW arrays to have equality of energy into and out of that junction, with consequential power and impedance implications. This further aspect of this invention develops that teaching to checking and making adjustment to achieve substantial equality of impedances at each junction along with doing likewise as to travelling wave traverse times round each RTW component circuit signal path having an integer multiple relationship with the clock frequency period. Preferred implementation is by way of a data-base for the structure of the RTW component circuits together with built-in test functions for verifying and modifying to improve a layout as tested.

To this end, suitable simulation alternative to industry-standard simulations uses data for nodes (or junctions) and paths (or lines) connecting the nodes. For the dual parallel transmission line conductors, corresponding paths are paired between their interconnections (nodes), and share a mutual inductance. Connects for timing signal take-off to loads constitute other paths making nodes with the paired lines or paths. Each node has an associated prescribed timing signal phase, while each path has associated capacitance and inductance. At least the paired paths also have mutual capacitance and mutual inductance, and the direction of travel of the timing signal can be taken into account.

Suitable verification involves calculating the impedances of the paths and node-by-node summation as to incoming and outgoing signal flows being equal thus in cancelling relationship, otherwise modification is applied; and calculating the time 10 delays path-by-path as to matching (at the clock frequency concerned) relative to the timing signal phases at the nodes connected by the path concerned, otherwise other modification is applied.

Suitable modification involves making changes to the inductance anchor capacitance of the path concerned, and impedance and time delay can be changed independently using built-in data manipulation functions operative to find matches by change to one or more items concerned. This is readily done for time delays as the reference is always the same known value. For impedance mismatches, effective operation is achieved by increasing impedance along the path from the higher to the lower of the impedances concerned, which can be viewed as surplus and deficit of impedance, respectively. Preferably, this is done after pairing up nodes that have impedance, respectively. Preferably, this is done after pairing up nodes that have impedance errors that are substantially equal but opposite, then grouping for two or more to cancel one.

The "solve" stage will produce a calculated parametric detailing for the RTW component circuits, both as to conductive trace sizing and spacing within what has been specified and coinstrained and as to active cross-connection between the traces.

It can be useful to allow expert inspection of such detail, and to further allow changes to be made if adjudged to be necessary or advisable, whereupon any corresponding adjustments can be made automatically to "specify" and "constrain", and the "solve" stage repeated. This stage conveniently shows the cross-connection circuit diagram with parameters marked or available at a mouse-click, likewise the cross-connection circuitry at a respective position, and is called "circuits" herein.

If there has been indication of non-viability at any calculation stage, this is preferably, and often quite readily, accompanied by indication of which of the parameters could usefully be changed, advantageously suggest at least the sense of worthwhile change, say up or down as to value. Consequential changes will, of course, result in another iteration of the calculation phase, i.e. up to and including "solve".

After the "solve" stage as such, or as following any inputs in a "circuits" stage, the calculation phase is complete, and simulation can be done in accordance with industry-standard techniques, typically at present by application of Spice software. As is well-known, this requires heavy-duty data processing, which can take a long time on even the most powerful of currently available co-called personal computers (PCs) or even server-class microprocessors. Alongside developing the CAD layout software hereof, a powerful "engine" has been designed and built to speed up and generally facilitate processing Spice-type simulation, specifically as plural microprocessors interconnected and programmed to perform parallel processing on the data concerned, and same is seen as another specific inventive aspect hereof.

The results of simulation can conveniently be presented as a schematic outline layout of the component rotary travelling wave circuits with whatever may be desired by way of indication of parameters, and preferably further with capability to select any position for showing the tiring signal waveform as present thereat, which is seen as representing a further inventive aspect hereof.

This waveform inspection may result in certain parts of the transmission lines of at least some of the component rotary travelling wave circuit being deemed as not suitable for making timing signal take-off connections. It is advantageous for this waveform assessment procedure to be automated, at least to some useful extent say by stipulating a "worst-case" for waveform acceptability, and identifying, marking up and specifying lengths of transmission lines that do not measure up and are not to be used for timing signal take-off load connections, and this is also seen as a specific inventive aspect. Perhaps more usefully, however, resort may be had to adjustment of aforesaid padding or dummy capacitances as far as can alleviate any problems at least as to affecting where timing signal take-oafs are convenient The "simulation" phase will produce results more accurately than reasonably to be expected of the calculation phase (in which the checking/verification is intended to be included, of course). Insofar as such discrepancies mean that the simulated performance is outside specified target performance, adjustments can be made with further iteration(s) of the calculation phase as relevant thereto, with same followed by another "simulation" stage or stages, advantageously at least to some extent as a matter of user choice.

Reverting to one of the general aspects of this invention, namely preferred context of power usage minimisation, or meeting a chosen and specified target therefor, as an overall calculation constraint, it is a further specific inventive aspect that change to power usage indications be both permitted, preferably at least at some stages and further preferably at any time, whereupon there will be automatic recalculation.

Indeed, another specific inventive aspect that can have related utility is seen in "tear-off" type availability of any desired parametric or operational information at any stage and on any screen related thereto, whether further for immediate capability to change or automatic transfer of or to part or all of the stage screen concerned.

The final stage will be to go from acceptable simulation results to "layout" as such.

Exemplary specific implementation for this invention is shown in and described relative to the accompanying diagrammatic drawings, in which:

FIG. 4 shows screen display for four interconnected loops and auto-generator menu;

FIG. 5 shows a rig useful cross-talk assessment;

Figure 8:
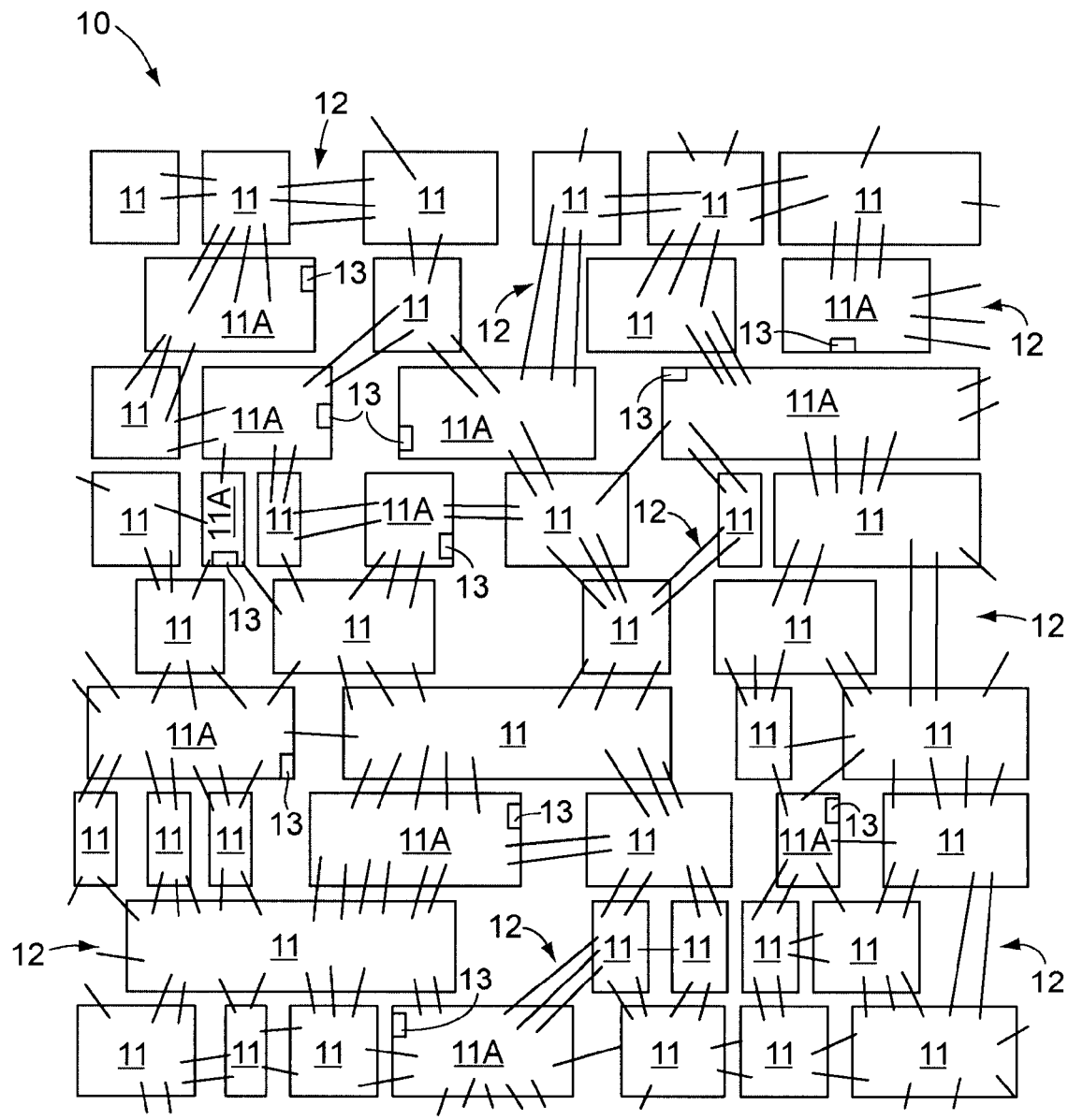
FIG. 8 shows a fragment of IC functional circuitry to receive timing signals.
Figure 9:
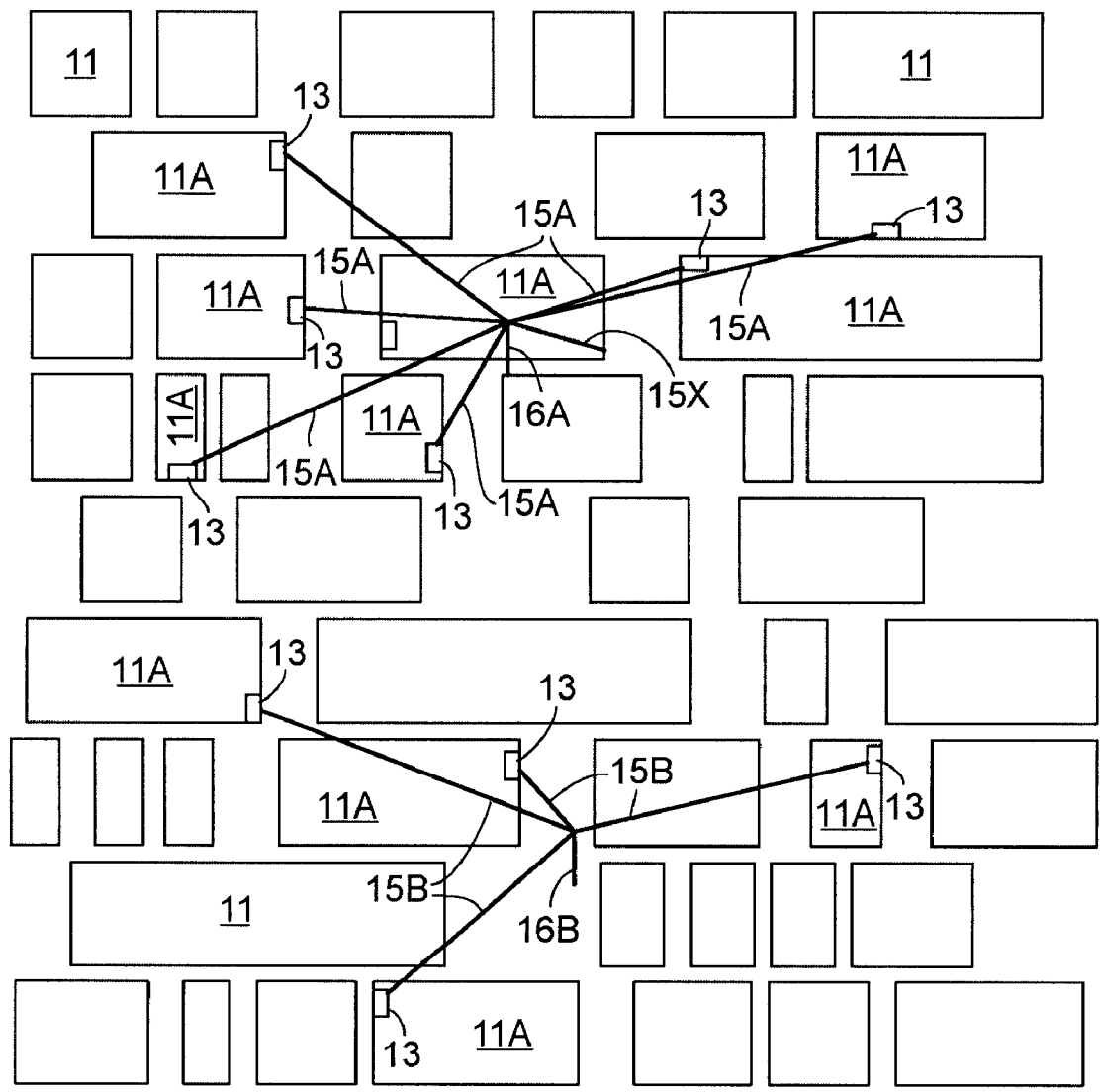
Figure 10:
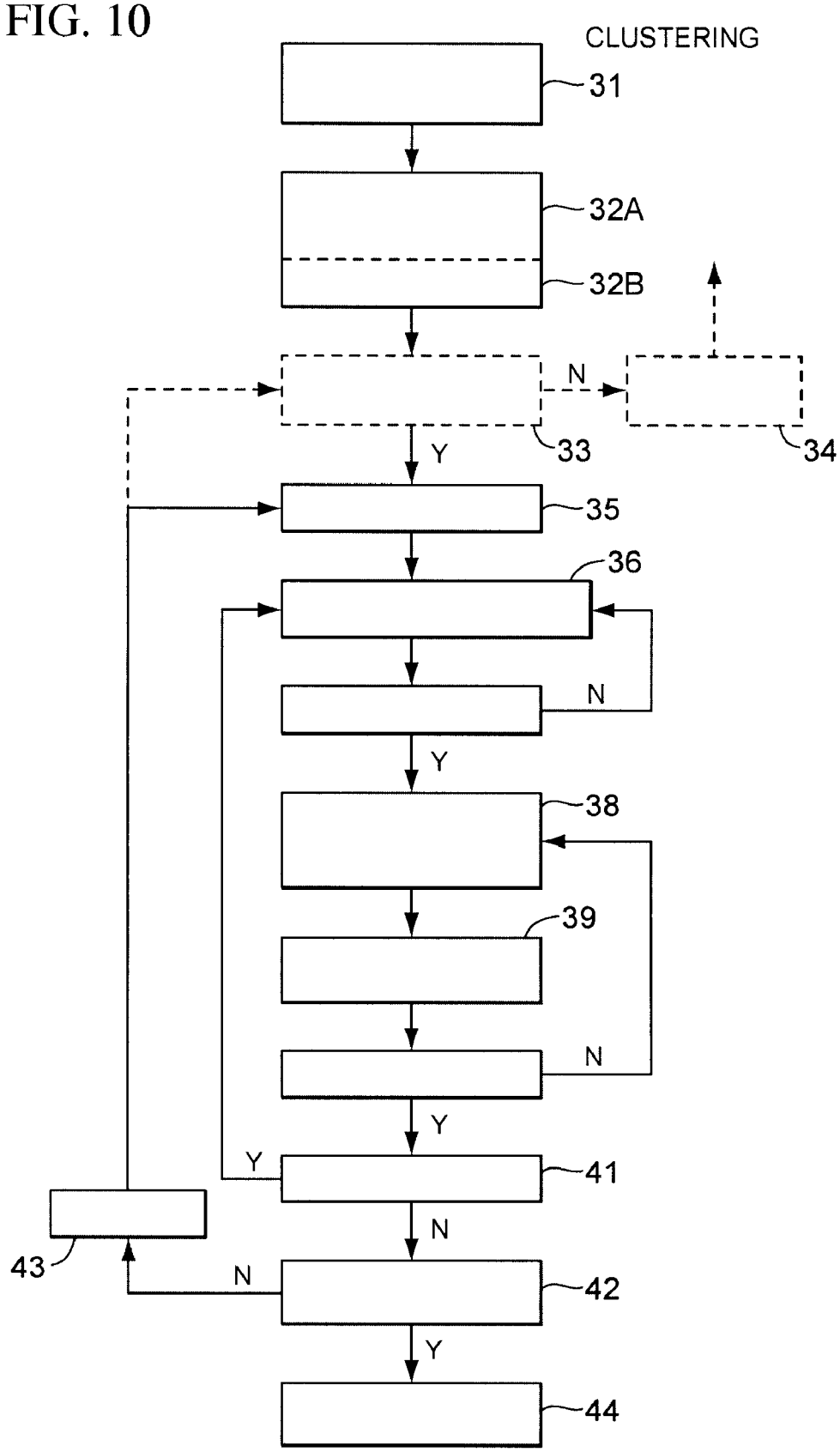
Figure 11:
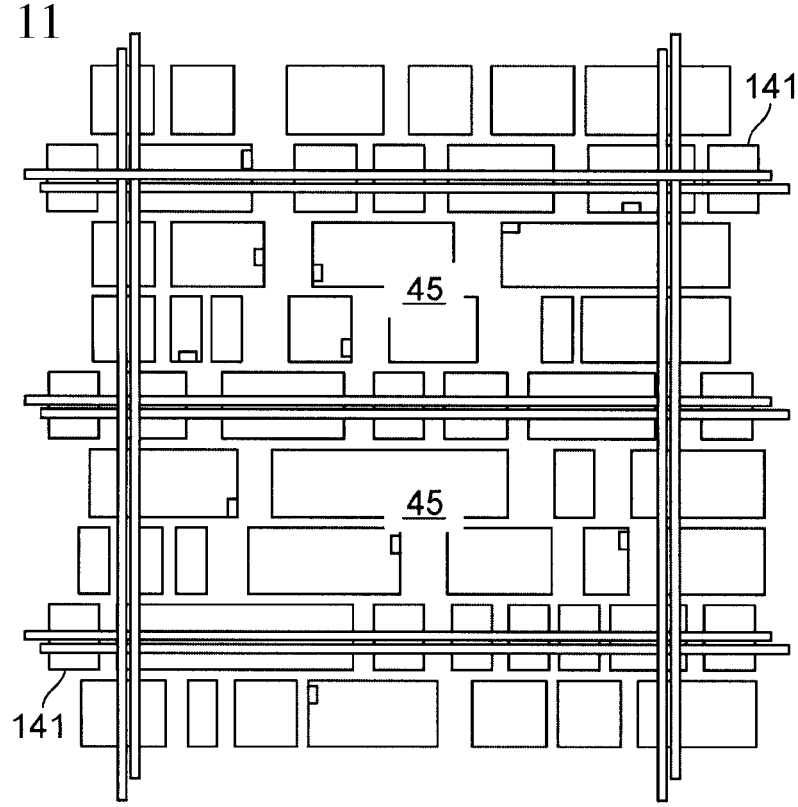
Figure 12:
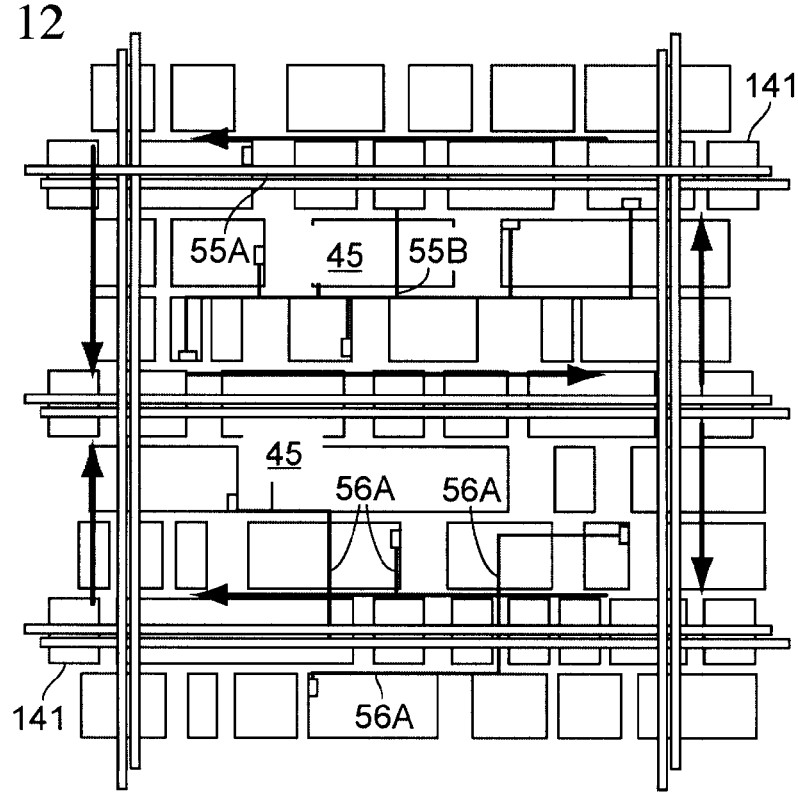
Figure 13:
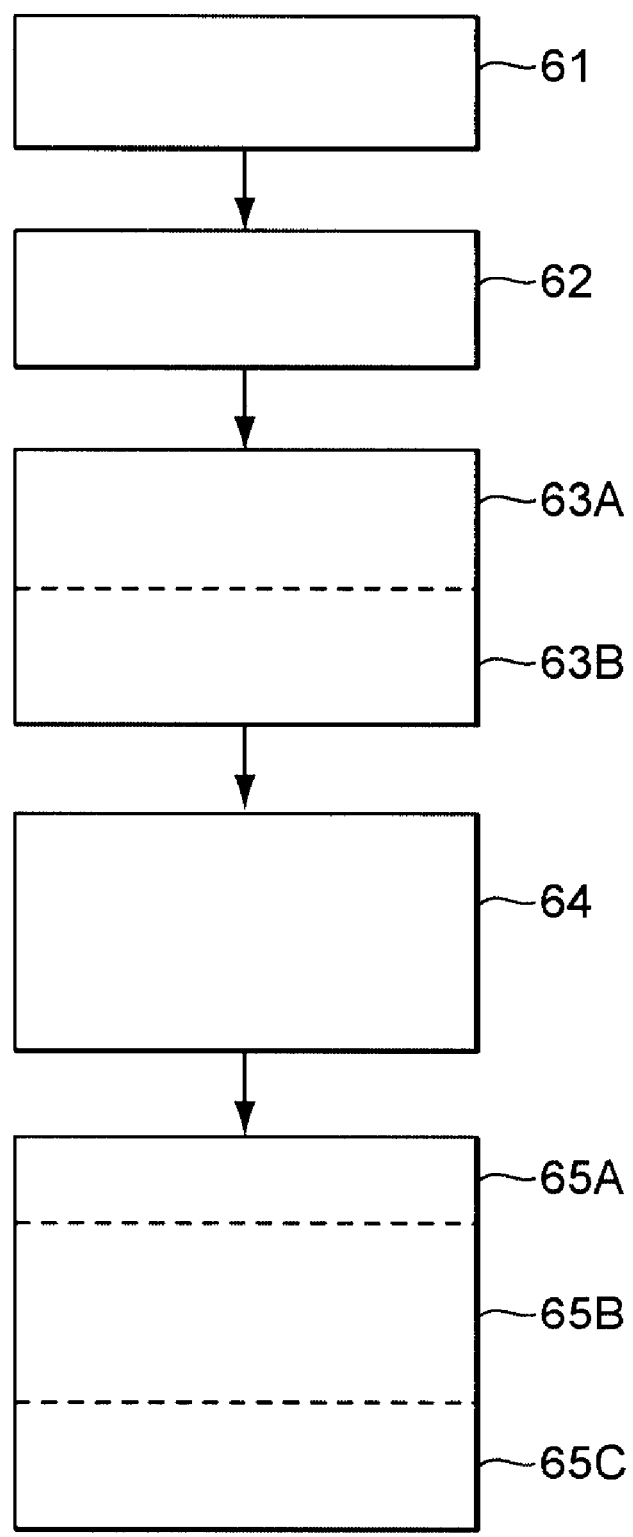
Figure 14:
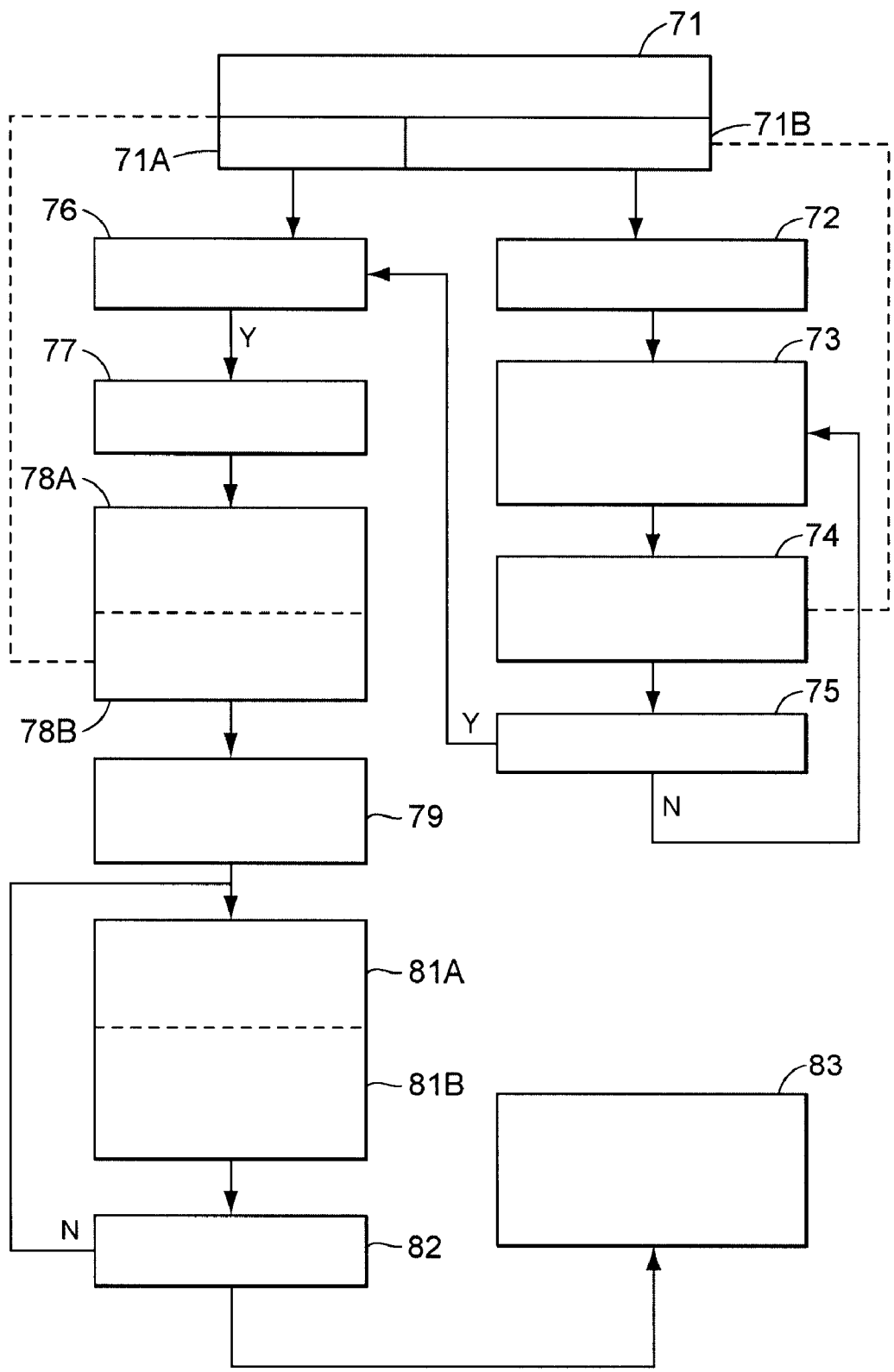
Figure 16:
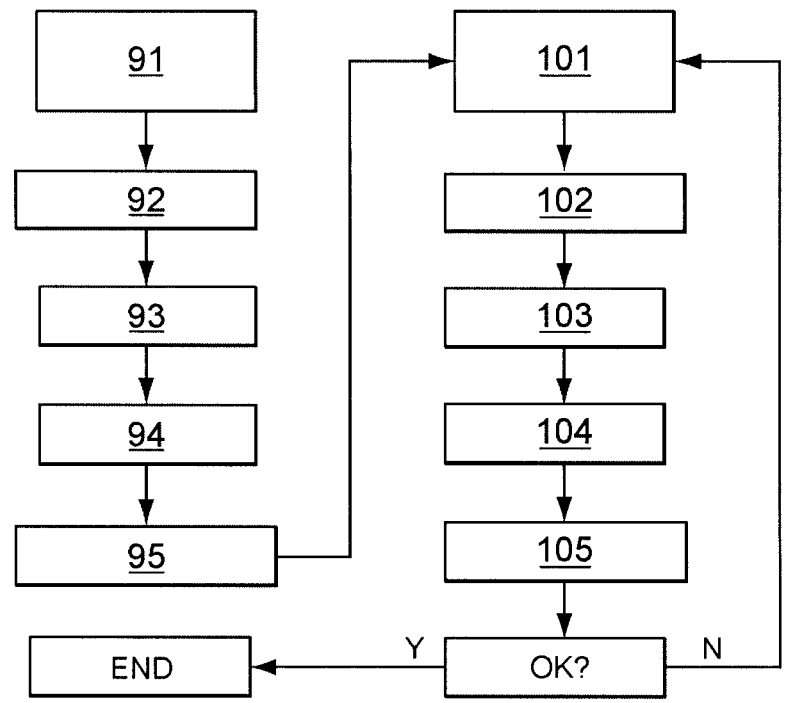
Figure 17:
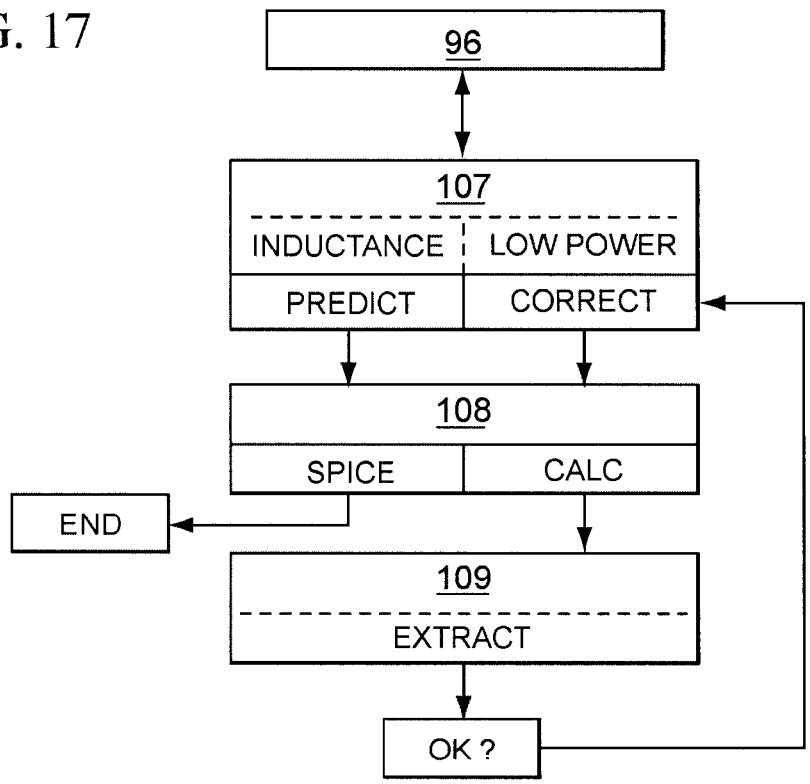
Figure 18:
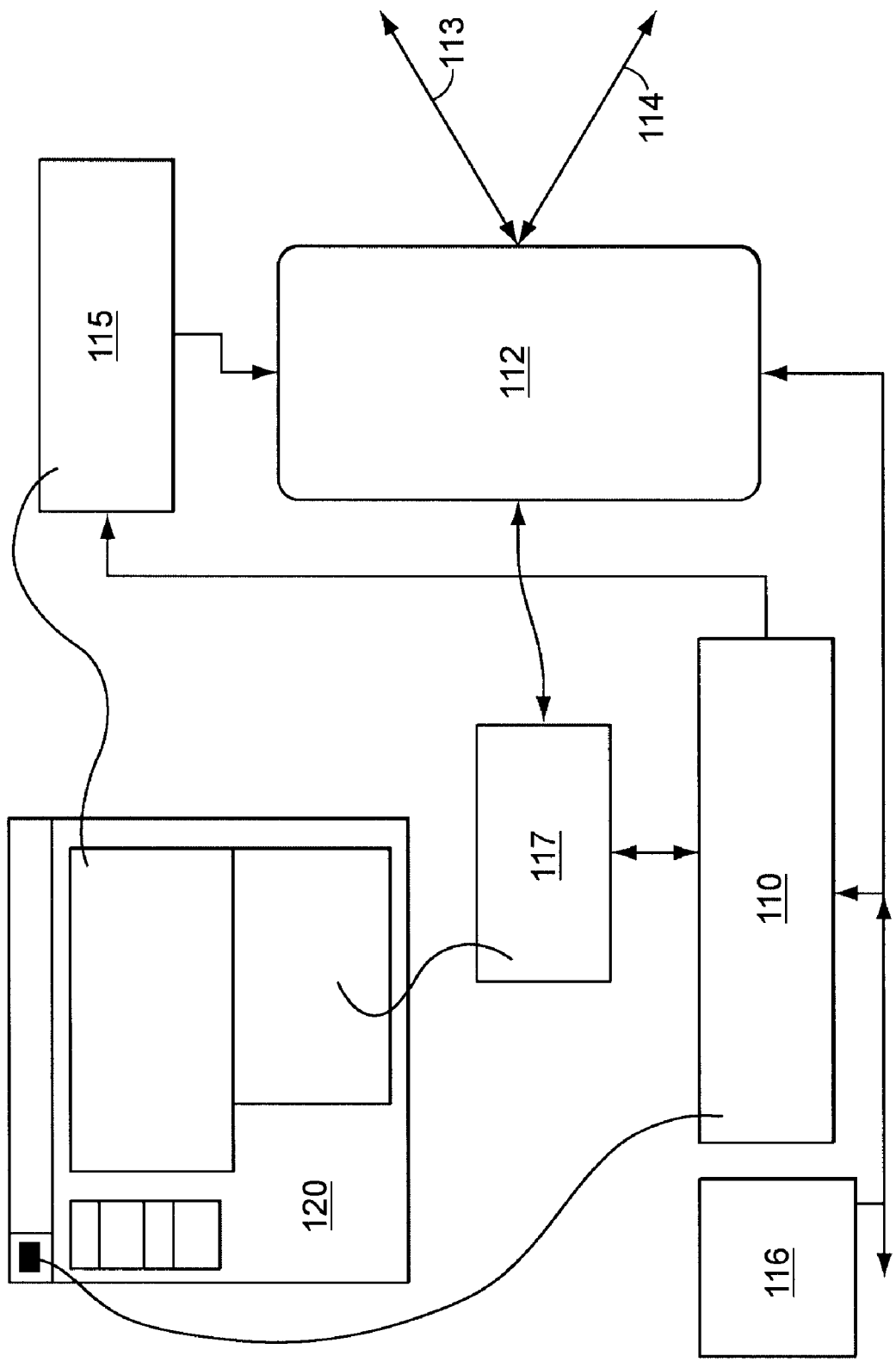
Figure 19:
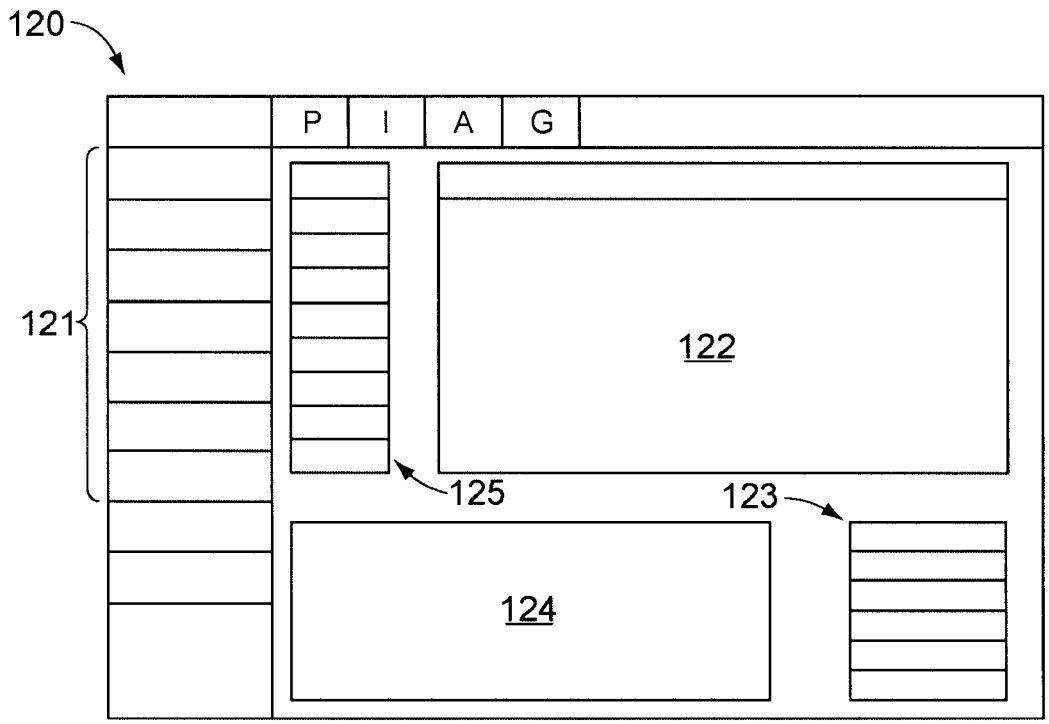

FIG. 9 develops FIG. 8 to show clustering of timing signal loads;

FIG. 10 is a flow chart for a clustering algorithm or routine;

FIG. 11 shows rectangular grid geometry for RTW component circuits;

FIG. 12 shows clustered loads of connected to RTW circuitry of FIG. 10;

FIG. 13 is a flow chart for an inductance extraction algorithm or routine;

FIG. 14 is a flow chart for a design and verification algorithm or routine;

FIGS. 15 and 15A–E are block outline and further features of a parallel simulation processor;

FIG. 16 shows successive functions for one embodiment of software hereof,

FIG. 17 is a program-style flow chart for such software;

FIG. 18 is a general overview of such software;

FIG. 19 shows outline screen content and FIGS. 19A–F variant details;

FIG. 20 is a basic transmission line cross-connecting circuit diagram;

FIG. 21 shows a cross-connection circuit specificable in various respects;

FIG. 22 shows a circuit for specifiable dummy or padding capacitance;

FIG. 23 shows an RTW array about free space and its bounding, and

Figure 24:
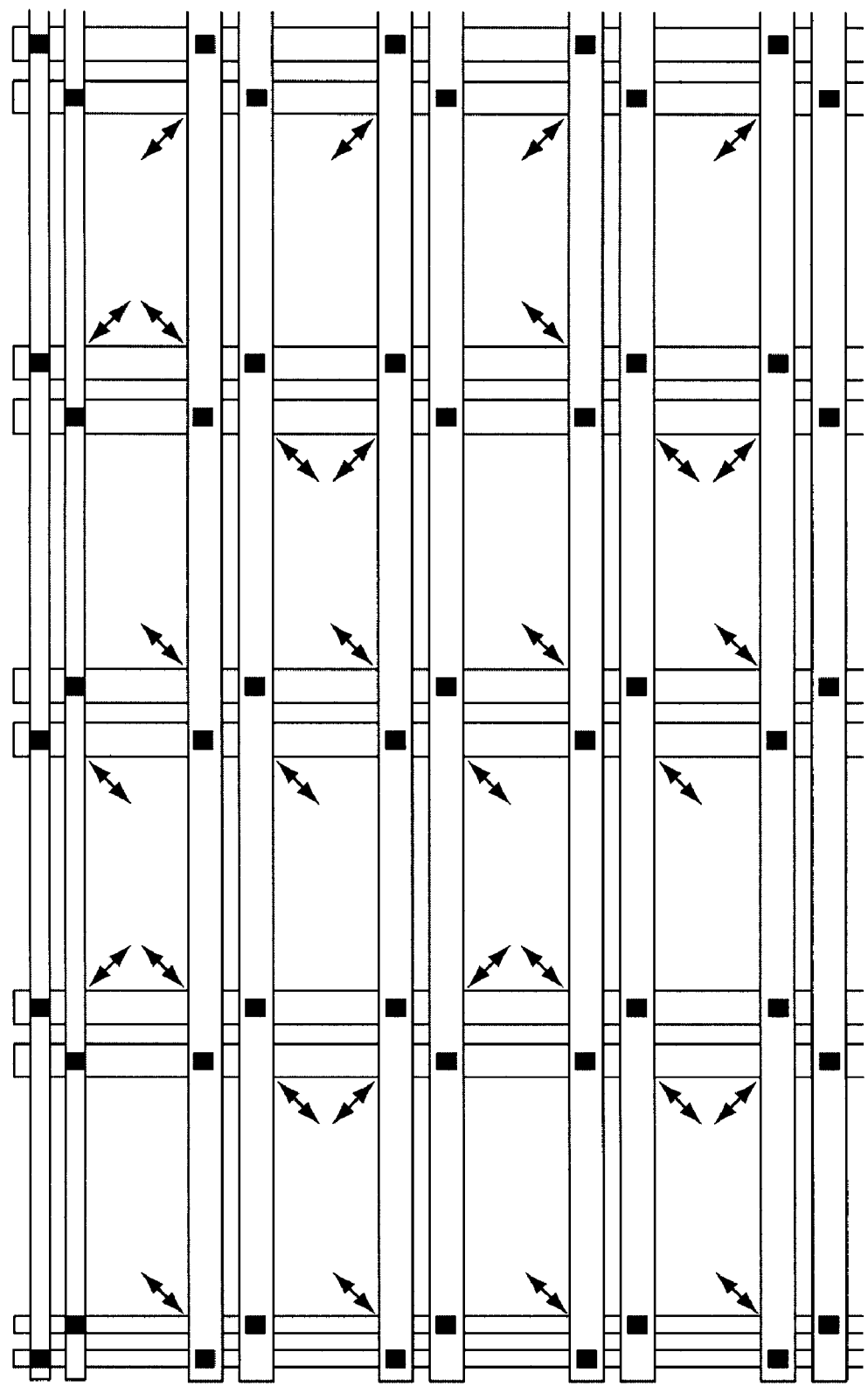

FIG. 24 shows rectangular gridding with interconnection features.

Figure 1:
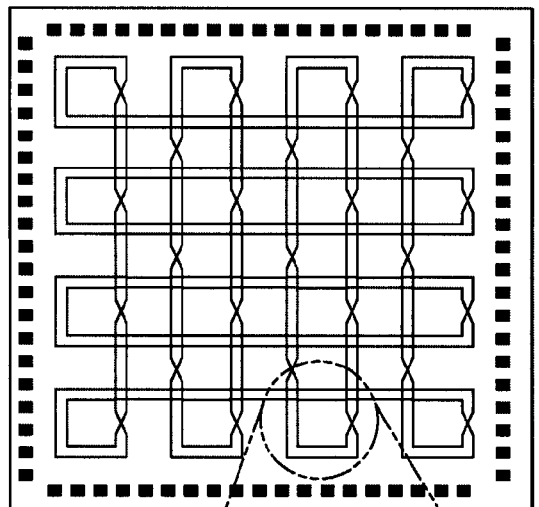
FIG. 1 shows an array of interconnected transmission-line loops for producing bipolar differential wave-forms.

Rotary Travelling-Wave Oscillator (RTWO) arrays, see FIG. 1, can provide a conceptually simple solution to timing signal (clock) generation and distribution problems or low-submicron integrated circuits. As replacement for clock trees, PLLs and DLLs it offers a solution believed to be readily scalable up to multo-GHz frequencies. The RTWO concept relies on inductance to give stable clock generation with multiple-phase capability.

As full ramifications of inductance extraction are still relatively unfamiliar conceptually to most VLSO digital circuit designers, it has been accepted that application of RTWO to clocking (Rotary Clocking) in the VLSI market, CAD support should, probably must, be aided by providing CAD tool teaching to de-skill the Rotary Clock design process. The aim is transparent calculation of significant electromagnetic and RF effects present in a target clock design, and reflection of these during simulation and design iteration. It is envisaged that a final output in GDSH or Gerber format could make the methodology and related software functionally equivalent to existing H-tree generation tools.

The RTWO concept involves operation not by resonance, but by the generation and maintaining of a rotating voltage transition in an endless differential electromagnetic path. A twist (or odd number of twists) in the path forces phase inversion during rotation, so that there is effective oscillation as represented in the resulting wave-form. Power consumption is low because of inherent energy recycling action, thus requiring only top-up energy by its regenerative provisions, see back-to-back diode pairs between loop transmission-line conductors in FIG. 2 and more circuit and idealized detail in FIG. 3. For a sharp voltage transition, the rotary action produces highly square waves directly. The regenerative circuitry is shown employing transistors to initiate and maintain the voltage transition and its rotation, thus availability of oscillation wave-form output, and to aid in providing rotation lock. Arrays of interconnected rings conveniently fabricated usually mainly on top layer metallisation act as an advantageous substitute for a conventional clock H-tee. Such an array is inherently phase-locked and can cover an arbitrary size. Taps can be made to take off local clock signals as required. All phases of the clock are available simultaneously, see marked for 45-degree positions.

Superficially, the basic topology may look like a ring oscillator, but operation is fundamentally different. Capacitance from clock loading becomes part of the transmission-line mechanism and energy is recirculated within the structures as the voltage transition rotates.

In principle, the perceived problems of VLSI clock generation amount to the generation and distribution of a high frequency clock signal over a large chip at high frequency and with controlled skew, jitter for fast edge rates. In practice, the following arise for resolution, particularly during design:

- minimising skew between clock signals over the active area of chip as caused by variable load capacitances
- controlling edge rates with lossy interconnects
- mitigating the effects of variability of active components
- handling transmission-line effects at high frequency including return-current paths and inductance
- minimising power consumption and synchronous supply surging
- coping with the effects of induced noise from the clock to other signal lines.

The methodology chosen involves defining the clocking interconnect prior to cell placement This is advantageous from an electromagnetics perspective and is not new in itself (having been used by such as IBM for its S/390 processor clocking), though post insertion is also seen as feasible for this invention.

Rotary clocking networks are subject to a different set of design constraints compared with conventional clock H-trees, at least in the following respects:

- RTWO lines are never terminated
- capacitive loading is readily tolerated by designing
- differential RTWO action gives a well defined go-and-return current path However, issues arising from noise-coupling can still be problematic due to the high circulating currents involved. Analysis of a typical section of RTWO differential transmission line with (see FIG. 4) underlying metal traces and a victim trace used to simulate crosstalk, and related test results, have been convincing as it being sufficiently accurate to represent RTWO transmission-lines as a series connection of lumped elements. When parameters of drive transistors and parasitic coupling terms are added, a short-section of the transmission-line can be modelled as in FIG. 3 (typical values shown).

The model circuit shows the most significant terms, i.e. the transmission-line inductance, series resistance, interconnect capacitance, clock signal load capacitance and transistor capacitance. It is to be noted that ACO represents an AC ground point (VDD or VSS). Transistor characteristics have only 2nd-order capacitive effects on the timing since they are operating in a transmission-line amplifier mode.

Equations governing the circuit include

Differential inductance (per unit length):
$$L_{perlen} = \left(\frac{\mu_o}{\pi}\right)\log\left\{\left(\frac{\pi \cdot s}{w + t_c}\right) + 1\right\}$$

Impedance of a segment
$$Z_0 := \sqrt{\frac{L_{lump}}{C_{lump}}}$$

Time Delay over a segment
$$t_d := \sqrt{L_{lump} \cdot C_{lump}}$$

Overall Operating frequency
$$f_{osc} = \frac{1}{2\sqrt{L_{total} \cdot C_{total}}}$$

Additional constraints on the RTWO system are:
- signal inversion must occur on all (or most) closed paths
- impedance should match at all junctions
- signals should arrive simultaneously at junctions.

Convenient implementation software could have a GUI written in Tcl/Tk. The syntax of Tcl is very simple, which would help for users with limited programming experience. Tcl/Tk also has robust cross-platform support C and C++ can be used where required for speed FIG. 5 shows a main design screen having a large canvas view of the clock design, preferably scaled directly from the custom physical layout database, a menu system, and an area for project notes.

The sidebar also houses the entry box that allows a user to enter a desired clock frequency, from which the software will look to generate a suitable clock design. There is also provision to compensate for any load on the clock. By a simple point & click, the user can specify the location and size of any clock load.

The processing hereof then solves the transmission-line equations for each section of the RTWO network. It maintains impedance and phase coherence by adjusting 'padding' capacitances (implemented with MOS capacitors), and adjusting the transmission-line geometry. Using all of the information available to it, the methodology and software hereof will estimate a viable, maybe ideal, physical layout to achieve a given frequency with a stable and reliable clock waveform, and display it on the screen.

From the set of lump-capacitance loads representing local clock stubs or buffers, the desired frequency and maximum metallisation utilisation limit, an internal layout database of closed-loop paths is calculated, impedance matched at junctions, and rotation-related phase inversion assured.

The basic design generation procedure is
- divide area to be serviced into rectangular regions each small enough for there to be negligible inter-region transmission-line delay at target operating frequency.
- divide perimeters of each such region into at least 8 segments suitable for approximating lumped transmission-line LCR
- determine parameters for time delays over each such segment to be nominally equal to cycle time of desired frequency divided by 16
- determine capacitance of each segment to nominally equal the sum of the largest envisaged differential load capacitance, loop-to-loop interconnect capacitance and active transistor capacitance
- determining addition to unloaded segments of padding capacitance substantially to match the lumped line capacitance
- determine inductance for each segment from the lumped line capacitance
- determine pitch/width of differential transmission-line conductors using Wheeler's formula constrained by metallisation factor involved
- determine suitable odd number of cross-overs of transmission-line conductors to meet cross-talk desiderata
- specify number of transmission line loops to cover the area to be serviced and their interconnections.

Verification can readily be by running a modified version of the industry standard Spice simulation tool on the design. This simulation includes the Spice LCR models and Mosfets, as well as electromagnetic simulation results of multiple 4-port subcircuits by FastHenry and FastCap.

As RTWO architectures stabilise quickly, most simulations will yield meaningful results quickly, say within 30 seconds of initialization. This allows the methodology and software to refine the design, by iterating a number of times and making progressively smaller changes to the layout to achieve the desired frequency. This entire process is user-configurable, from the command line used to start Spice, to the maximum number of iterations allowed. Most designs should take only a short time, say less than 5 minutes to achieve the required accuracy, with final pre-production processing no more than a few hours.

The electromagnetic simulation interface merits further mention. At Ghz frequencies, skin effects are evident even in thin metal conductors. For highest accuracy, inductance and resistance are calculated using FastHenry in multi-pole mode. Dividing and segmenting can be fully automatic—targeting the current penetration of skin and proximity effects beyond the 9th harmonic of the clock frequency.

In all but extreme cases, the methodology hereof should output a powerful and robust clock layout, ready for use on the users' own chip design.

In some cases, a specific design requirement may require more work, and the methodology hereof preferably allows users to influence, or even specifically lock, certain design variables. In software implementations, by navigating the menu system on the sidebar, users can alter almost all aspects of the design. For example, variables can be "locked", which will force iteration to use the user-defined values, and attempt to achieve the desired frequency by altering only "unlocked" variables.

Alternatively, the user may invoke a Spice run on the current design, by simply clicking on "Run Spice". This is much closer to a traditional design method, with the user entering the design parameters, and then viewing the results. As Spice runs, raw Spice data is read, and the graphical representation of the design can be coloured accordingly. In this way, it is possible to see the travelling-wave in action, preferably with on-screen display showing the clock frequency at all times.

Figure 6:
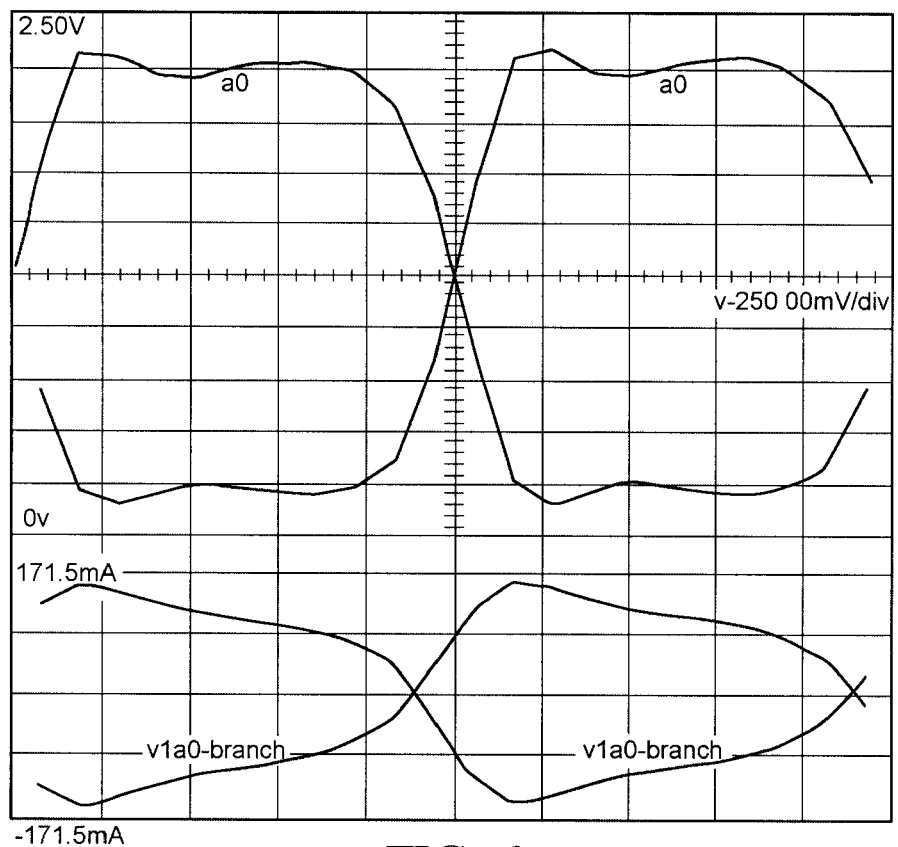
FIG. 6 shows screen display for skew analysis.

Skew analysis can also be provided, see FIG. 6. This displays measurements from two points on the design (selectable from the main design screen). This functions in the same way as a standard oscilloscope, and allows quick evaluation of the clock waveform shape.

Figure 7:
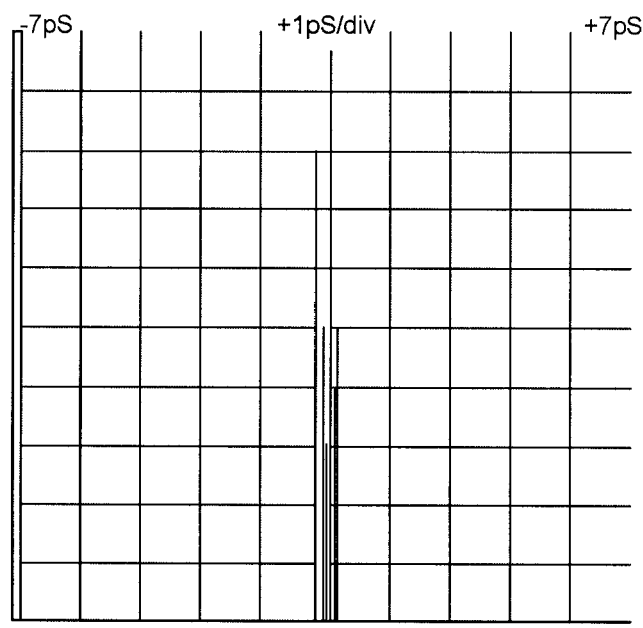
FIG. 7 shows screen display for jitter analysis.

Jitter analysis can also be provided, see FIG. 7 for display relevant to the cycle jitter in presence of simulated power supply noise that can be of user-selectable amplitude and frequency.

Further preferably, provision is made for built-in links to a freely available Spice viewer, SignalFRAN, see FIG. 8. This allows more detailed measurement of the clock initialisation phase, and can be run simultaneously.

Outputting results can be by standard GDSII, say by simply selecting the required item from the menu for generation of a properly formatted output file from its internal layout database. Such file could be immediately ready for importing into the users own design tool. The layout may then be subjected to the users usual design checks (DRC/LVS etc.), and re-simulated as a complete design (Spice, or other simulation tool).

It is believed that understanding of the inter-active software embodying this invention will be best understood and appreciated from farther outlining the context within which it is to operate and the objectives to be achieved, which starts by reference to FIGS. 8 and 9.

FIG. 8 shows part 10 of an IC layout of its functional circuitry as blocks 11, 11A with interconnects 12 representing logic signal flow within each timing signal or clock pulse. Some of the functional circuit blocks, see 11A, require timing signals for gating purposes, typically registers 13 for taking in or outputting data and/or instruction signals. For immediate purposes of this description, the functional circuitry 11 is taken as being substantially fixed physically, i.e. as to location and relative proximities, which is worst-case of what could be presented initially for clock layout purposes. This may not exclude all flexibility, e.g. may permit re-location within constraints such as to maximum lengths for the interconnects 12. Whatever latitude is permitted can be taken into account in the clock layout design hereof, if specified clearly.

Figure 2:
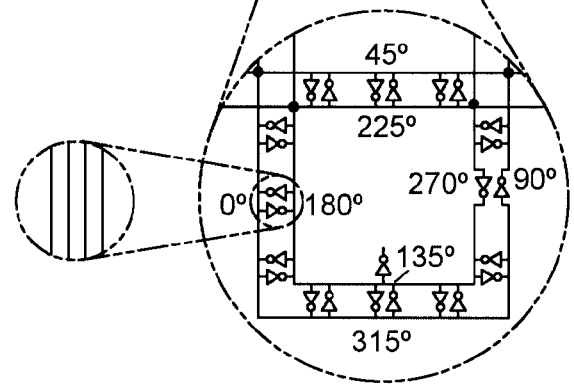
FIG. 2 is a circuit diagram for one such loop.
Figure 3:
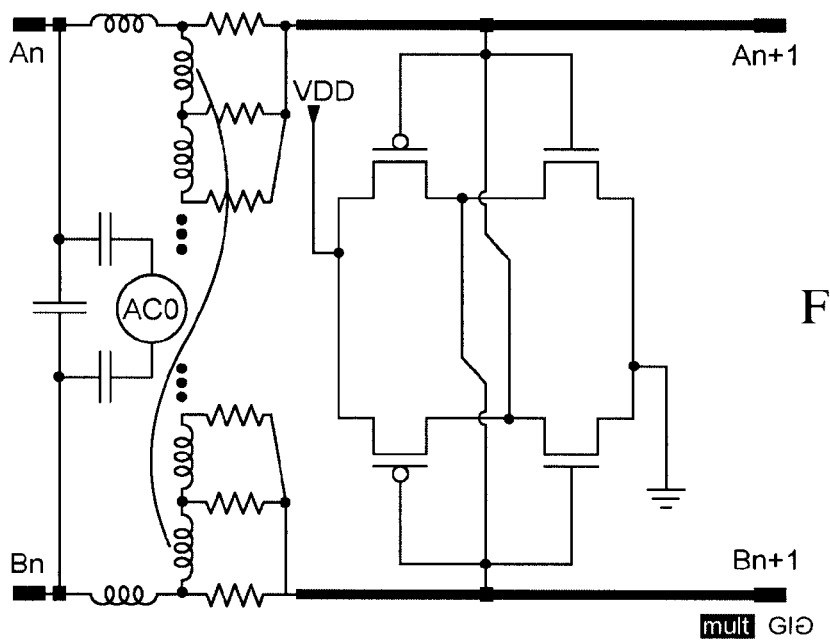
FIG. 3 is an idealize diagram including regeneration provision.

There will usually be many more functional circuits 11A requiring timing signals than there are RTW component circuits of which their endless travelling wave signal paths will have only one position for any exact timing signal phase. FIG. 2 shows grouping of the blocks 11A requiring timing signals into what are herein called clusters, one shown with calculated conductive first connects 15A for timing signals to its registers 13 respectively, another likewise for first connects 15B. The registers 13 constitute timing signal loads. The first connects 15A and 15B go to common points 15X and 15Y, respectively, that are calculated as geometric centres (centroids) for the respective clusters of loads 13 served by respective first connects 15A, B. The centroids 15X, Y will have calculated second conductive connects 16A, B to positions on each of different RTW component circuits that correspond to the required phase of timing signals.

This clustering of FIG. 9 is achieved by the exemplary routine of FIG. 10. From entered/extracted data (31), overall total load capacitance and an average loads capacitance for each RTW component circuit are calculated (32A), and said total divided (32B) by said average. The theoretical minimum number of clusters might be little more than such total divided by the maximum loads capacitance that can be driven by each RTW component circuit, and this could be used as a start point, but with the practicality of provision for increasing them. It is preferred to use a lower value for driven capacitance, i.e. said average loads capacitance, which can be set together with a practical margin below such maximum, and contribute usefully towards potential for achieving desirable even-ness of loading of the RTW component circuits. Ideally, the result, as a number of clusters, should not exceed the maximum number of RTW component circuits that could be provided; indeed, can usefully determine a lesser such number. FIG. 10 shows possibility of clustering-driven increase in the number of RTW component circuits, see dashed at 33, 34.

An initial allocation of loads to clusters (35) can be done in virtually any way, even including arbitrarily. One simple algorkhm-driven way could be related to physical locations and targeted substantially equal numbers and/or summed capacitances in each cluster, say bearing in mind said average capacitance loading calculated for the RTW component circuits and any disparities of skew tolerances that can be really spread within clusters. If multi-phase timing signals are to be used, say for multi-phase logic or even phase-graded to suit a flow of logic functions, this can also be taken into account On the current fully synchronous, effectively one-phase for-all, paradigm, only one position of the signal path of each RTW component circuit would be used, so it can be sensible to take some account of likely locations those positions of the signal paths, or at least their spacings, say (bearing in mind typical skew tolerance) actually along a substantial usable part if not most of one side of each of rectangular such signal paths in an orthogonal grid lay-out for such circuits (see later for routing and FIG. 11).

A simple first allocation algorithm could be according to values of X- and Y-coordinates being within pre-set differences or ranges (see more below), and clustered load capacitances not exceeding said average, then allocating left-over loads to the cluster containing the X-Y nearest load, but might be even simpler, even arbitrary, as this first allocation is normally non-critical in view of what is achievable using the following steps of a preferred clustering routine, and as preferred geometries of the signal paths of the RTW component circuits effectively inherently militate against any load connects being longer than a maximum therefor that avoids "ringing" effects due to unwanted reflections.

These steps comprise the repeated step (36) of calculating the centroids of each cluster, and a repeating loop of calculating the distances of each load to the nearest cluster (38), then moving each load to the nearest cluster (39). Whatever new load-to-cluster allocations arise are fed back (41) to the clustering step (35); and the cluster centroids calculation (35) and load distances/movement etc steps (36–41) are repeated until no loads get moved, or a maximum iteration count is reached.

A distance metric should be chosen that will give acceptable convergence. Suitable such metrics within the mathematical competence of the inventors, but not in any way intended to be limiting, include (A) $(Xc-XL)^2 + (Yc-Y_L)^2 + k.F(|Pc-P_L|) + c.G(C_L+C_L)$ (B) $\{(Xc-XL)2 + (Ye\ YL)2 + k.F(\ )PC-PLI))*G(CC+CL)$ where subscripts "C" and "L" denote "cluster" and "load"
X, Y are usual Cartesian co-ordinate distances
P, C are phase and capacitance
k, c are user-defined skew tolerance and group capacitance scaling factors, e.g.
  $k = $ (required cluster size)$^2$/F(phase skew tolerance)
  $c = $ (required cluster size)$^2$/G(max total capacitance per group)
F, G are positive monotonically increasing mapping functions, the aim being to increase rapidly when the arguments reach cut-off values for maximal total capacitance or phase tolerance. A good staring point has been found to be $F(x) = G(x) = x^2$, and 40,000 loads in 100 clusters have been processed using a 600 MHz Pentium with ease.

Of course, if there was any risk of over-long load connects, there could be a check against a pre-set maximum connect length, say as a first stage of moving loads between clusters, which is conveniently included in the clustering step 35, say with a margin in view of routing likely to result in paths to which those calculated have a hypotenuse relationship, see later.

One further checking step is shown (42), as to whether any cluster has greater than maximum loads capacitance. If so, the number of clusters will be increased (43) and the steps 35–42 repeated, if necessary after increase to the number of RTW component circuits (using 33, 34).

Loads data for this clustering routine can be readily determined, if not given, e.g. extracted from LEF/DEP format available at www.si2.org, or other open-access databases using automated script.

Completion of clustering can be a convenient stage at which to determine dummy or padding capacitances to even up capacitance round the signal paths of the RTW component circuits, and doing so may be effectively a final step (44) in the described clustering routine. This can and usually would be a first assessment to be followed by re-assessment later, say balancing for slight errors found in Spice-type industry-standard simulation. Adding capacitance to endless signal paths of a transmission line nature in an orderly way can compensate for non-uniformity introduced by connects to loads (which will be concentrated onto) less than about 25% of the total signal path length for the one-phase fully synchronous paradigm), and contribute as far as can be to the ideal of signal path parts exhibiting the same gradually changing impedance especially between as well as through junctions. It follows that RTW component circuits would actually benefit from multi-phase timing signal measurements or even fill phase-grading, as such could lend itself to more even loading of the signal path throughout its length Indeed, it is noteworthy that full phase-grading (or flow as it may be called) would also reduce topology constraints on RTW component circuits and arrays, and actually simply CAD design mainly to looking for the Kirchoff-type junction conditions to be met.

When clustering is complete (44), routing is determined for actual connects of the loads as they will be set out in the IC concerned A suitable inventive routine hereof takes advantageous account of functional circuitry to be timed or clocked generally having skew tolerance, which translates into twice the percentage of the signal path length of the RTW component circuits, which, for typical skew tolerance of at least 10% conveniently translates to most of one side of substantially rectangular such signal paths being available for making load connects, even for quite highly asymmetric rectangular such signal paths.

A suitable and practically advantageous signal paths geometry is shown in FIG. 11, for convenience superimposed on the functional logic blocks of FIG. 8 and 9. This geometry is basically substantially rectangular for signal paths as shown complete only for two column-adjacent paths 45A and 4513, see later for more on this geometry and its full areal coverage with active sides-sharing RTW signal paths, rather than corner-only sharing that leads to "virtual" servicing of a substantial part of the area serviced.

Reverting to the routing routine, the positions of the signal paths that are available for connects to loads at any particular phase or phases are known. For the particular contiguous asymmetric-rectangle array geometry shown with arrows for rotary signal flow, and for an IC following the one-phase synchronous paradigm, but with skew tolerance taken into account, these positions are at alternate row-following pairs of conductor traces, typically along a major central portion of the length of a longer side of the signal path they contribute to defining. This gives full pitch information for those portions so available for load connects at whatever particular phase, including as to length for any particular skew tolerance. If the grid array is pre-located, say by its relation to the area to be serviced with timing signals, the X-Y coordinates of these available signal path lengths follow, including relative to skew tolerance in the making of load connects. The routing routine could then simply be based on a first algorithmic step that finds the available connect length nearest to the also known centroid of each cluster, and make a single connect accordingly (as 16A, B in FIG. 9), then typically with best registration to the exact nominal phase involved. Preferably, however, a second step looks for making load connects to the identified available signal path portion that ignore the centroid, and can make direct individual connects that take account of skew tolerance for each load of that cluster, say at least for the loads presenting larger capacitance. Orthogonal row/column parallel routing is indicated in FIG. 12, which shows a mix of direct load connects 55A, 56A and an effectively star-wired small network (55B) of connects as might be dictated by low load skew tolerances. The only constraint required is that no load connect, if longer than the sum of calculated portions 15 and 16 in FIG. 9, should exceed the known maximum for avoiding ringing reflections. Many will be shorter than the sum of the relevant calculated portions 15 and 16, and any that are longer should not exceed the margin referred to above, at least if the hypotenuse relation is used.

If there is scope for adjustment of the array of RTW component circuits, say to avoid coincidence or undue proximity to any logic signal lines (12 in FIG. 8) or destinations (13 in FIG. 8), that may be done within this routing stage, say immediately before or in conjunction with finding nearest centroid available signal path portions. An alternative or additional resource would be to exercise any latitude as to exact positions of the IC's functional blocks (11 in FIG. 8). This routing routine can readily extend to, or simply be used alongside other software [for,] the layout of the lines 12 for signals in and out of the functional blocks 11.

Given that the importance of inductance cannot be overstated at very high-clock speeds and very small feature sizes, including the hazards of cross-talk noise between RTW signal paths and signal lines to and from functional blocks, routing is advantageously followed by investigation of inductance. Whilst inductance extraction can be done using simulation software such as the well-known FastHenry, those tend to be rather slow, and it is preferred herein to use another inventive calculation routine hereof that can be up to about 15% less accurate, but is much faster.

Turning to FIG. 13, this inductance extraction routine involves selecting (61) a rectangular region about the RTW line and other wires of immediate interest, and imposing (62) a grid as large and as fine as desired accuracy requires. The RTW line is decomposed (63A) within the imposed grid into straight-line segments, and the other wires represented (63B) as weighted idealised no-thickness lines in parallel. For each grid point, and each parallel line, the mutual inductance per unit length is calculated (64) on a typical thin wire basis in the X and Y direction, specifically using the integral function $$\text{Inductance/unit length} = \{\mu/(4\text{pi})\} \text{Int} 1_G, 1_W d_1 / \text{sqrt}(X^2 + Y^2)$$

where the integral is along the RTW line signals

X and Y are distance from the line segment to grid point $1_G$ and $1_W$ are the unit direction vectors of the grid element and the RTW line, respectively.

Mutual inductance along the other wire is then obtained (65A–C) by straightline segmenting the other wires (65A), integrating (6513) the other wire segment unit direction vector and the grid position unit length inductance along the other wire 15 through the grid area, and summing (65C) for the mutual inductance of the other wire. This routine can end with a step identifying undue mutual inductances and instigating adjustment(s), feasibly automatically indicate specific viable adjustment(s).

The calculated lay-out is then subjected to another inventive routine hereof for first design verification by calculation much faster than industry-standard simulations. Indeed the purpose of this routine is to get a faster first result than using Spice type simulation, advantageously as a precursor with useful corrective potential before such industry-standard simulation The innovative nature of the routine arises from its basis simply in rules for impedance matching at each junction between conductive traces involved in the array of RTW component circuits, and in their endless signal path travel times needing to be an integer multiple of the desired operating frequency period.

FIG. 13 shows a specific such routine staring from creation (71) of a database comprising "nodes" representing said junctions and "paths" representing interconnects of the nodes, with paths sharing a mutual inductance paired together to represent the dual trace transmission-line rotary signal path structure of the RTW component circuits arrayed together in FIG. 11. Data for each node will include its location and associated tiling signal phase, and data for each path will include the direction of signal travel along it, at least its associated capacitance and inductance, advantageously further its relevant mutual capacitance and inductance to another path.

Perhaps somewhat artificially, the data-base (71) is shown supplying node data (71A) and path data (71B) separately to step sequences of the routine, one (7275) correcting for time delays, the other (76–81) correcting for impedance mismatches, both of which can be done independently of the other.

The data-base (71) also contains data manipulation functions for getting matches by changing values of one or other of two items concerned. The time delay correction sequence is shown comprising calculating (72) signal transit times for the paths, path-by-path comparison (73) of those time delays with the timing signal phases for the nodes inter-connected by the path concerned, followed by adjusting (74) its capacitance and inductance to correct any mis-match (preferably without changing impedance), and updating the data-base; and repeating (75) steps 73 and 74 15 until all paths have been processed. The impedance correction sequence is shown being enabled (76) after all time delays have been processed (71–75), and proceeding by calculating (77) the path impedances (taking account of any changes from time delay correction), node-by-node calculation of total impedances of input and output lines of each node, storing non-zero difference results along with the node location or other identification, separating positive and negative impedance differences and grouping them (78) so that those that are equal and opposites are pared, and others each further associated or "paired" to more for cancelling out. Then, for each association of a positive and a negative impedance difference, this routine finds (79A) a route (preferably the shortest) along the paths between the nodes concerned and increasing (79B) the impedances of the paths of the route concerned by the difference or partial difference concerned, while keeping the time delay constant. When all paired and plurally associated "pairings" have been processed, the adjusted RTW component circuits array is ready for industry-standard Spice-type simulation.

FIG. 15 shows outline of a sixteen-way parallel processor 80 arising from perceived advantageous speeding up of Spice simulation processing hereof for VLSI ICs, such as microprocessors. Sixteen computing units 81 and an overall controller/scheduler 82 for parallel processing have ethernet interconnection to which FIGS. 15C and 15D relate. FIG. 15A shows one computing unit 81 comprising a motherboard 83 carrying a microprocessor 84, pre-loaded Spice-based program 85, RAM 86, and ethernet connection 87. FIG. 15B shows the controller/scheduler 82 as comprising ethernet connection 88, four hub units H1–H4, and a master hub and server unit 90. FIG. 15C shows ethernet connections between the computing units 81 and to the hubs H1–H4 (according to the numerals in the computing unit boxes). FIG. 15D is a diagrammtic indication using double-headed arrows for node-sharing interconnections between four computing units clustered to handle simulation of one section of an RTW component circuit In this parallel Spice-type processing, the RTW array for simulation is sectioned for each computing unit 81 to deal with a different section, and simulated voltage values to go directly between versions of Spice in each computing unit, the linkages concerned emulating the real linkages in the RTW array structure.

The alternatives of computing units 81 being connected together directly or via a hub speeds up data transfer between time steps, especially when two computing units share an RTW circuit node.

Spice-based transient analysis is done in time steps and the parallel processor hereof involves transfer of RTW node voltages between two computing units (FIGS. 15C and 15D), the received voltage being used to calculate current source strength for the shared node for the next time step. The current source strength is the ratio of the difference (V1–V2) between the voltages at the two computing units concerned and the resistance of the (virtual) link between them, which should be low to enhance to node coupling. Damping is then applied to the current source strength as an exponential function to combat current surges. It was found that this was more stable and tractable than modelling as voltage sources.

Controlling the time step size centrally (62) enhances performance and accuracy, particularly keeping constant across the cluster. Setting the time step to the largest acceptable value satisfies the error tolerance constraints of each node, and all of the computing units lock satisfactorily to the same simulation time.

A suitable software interface emulates interfacing to a single computer, so the actual parallel processing does not affect Spice simulation results. Spice simulations are readily available to the user of the CAD software hereof at all points of the simulated system, thus allowing direct access to simulated frequency, voltage anywhere, current flow, etc; thus deriving of y data from sequential nominal same-phase points on waveforms, rise/fall times, rotation direction, etc; direct control of sizing any transistor, inductance component values, take-off loading, also padding capacitance value and location, Spice time-step, etc; and effective control of frequency according to global scaling of interconnect inductance, investigation of rise/fall by segmenting more finely, etc.

A useful interactive protocol for this Spice simulation processing comprises

1. First having accuracy low but simulation speed high by way of setting a coarse time step, say 5% of the projected tiring signal cycle.
2. Consequently quickly reaching an initial stable Spice result determined by checking for squareness of waves throughout.
3. Checking rotation directions and if rise/fall times have acceptable values for expected operation, otherwise continue Spice processing for longer.
4. Increase accuracy to medium to get results more truly representative of the RTW array.
5. Record simulated operating frequency after a few cycles and reduce or increase preloaded dummy capacitance all round the RTW array if too low or too high, respectively and repeat until satisfactory.
6. Examine rise/fall times and waveshape quality, including voltage/current ratio (Z) everywhere to locate worst impedance problems and make corrective local inductance/capacitance adjustments—and iterate until improvement deemed satisfactory or no more achievable.
7. Apply extremes of tunability to check such as switched capacitor and varactor effectiveness.
8. Run worst combination of process variables, temperature, voltage and check if specification still met—if not, consider redesign for such as more area for tuning components.

Having outlined application of arrayed RTW component circuits to distributed generation and supplying of timing signals to ICs, and described and illustrated individually innovative routines useful for CAD design and layout of such RTW array, more general CAD aspects hereof are now reviewed.

FIG. 16 shows a typical overall design procedure hereof that includes predictive calculation (91) and corrective calculation (101) with the latter iterating essentially the same sequence of first simulation (92, 102), layout (93, 103), extraction (94, 104), and second simulation (95, 105).

FIG. 17 shows translation of FIG. 8 into a program flow chart and diagram demonstrating the basic pattern of assembling an application-specific data-base (96) from which calculation (107) phases always precede simulation phases (108) with accompanying layout/extraction (109) and iteration from predictive to corrective calculation, feasibly further recalculation iteration(s) until satisfactory, and calculation indicated as being in a context including taking account of inductance and optimising against power consumption.

Viability of the inter-active CAD software hereof is believed to be well supported by its capability to operate satisfactorily using generally open-access other software. FIG. 18 is an overview of typical such use. Specifically, the software as developed to date and described thus far is dubbed Rotary Expert (110) and now 20 shown in conjunction with the Gemini database (112) from which access is available to such as LEF/DEF (113) and API etc (114), and the recently released Cadance database DbView (115), also the well-known Spice, Fast Henry, Fast Cap and other Extractors (116), and the invaluable Magic (117), all relative to Rotary Expert's graphic user interface 120.

In relation to the inter-active CAD software hereof the graphic user interface 120 is now described in more detail with reference to FIG. 19 and detail FIGS. 19A–19F. One panel 121 of permanently available selectables is shown at the left-hand side and their selection brings up screens specific to progress of the CAD software. These screens will vary to some extent according to selection of access shown at the top of the screen to correspond with "preliminary" (P), "intermediate" (I), "advanced" (A) and "guru" (G). Broadly, though, the screens have a common but highly flexible format with up to four sections of displays, typically one area (122) that is often occupied by a view of the RTW component circuits array as processing progresses or displays from DbView, two other areas 123, 124 either (and usually at least one) specific to particular ones of the selectables 121 or (and usually not more than one) for importing from what is normally in another screen, and a fourth area (125) that can be specific to the current screen or allow importation from other screens or serve for functions on a "tear-off" basis that can be from any screen or from a repertoire thereof that can include options not considered specific to any particular screen or screens. The sizes of these areas will vary, or can be varied, to suit the screen involved and/or the user's preferences.

Figure 19A:
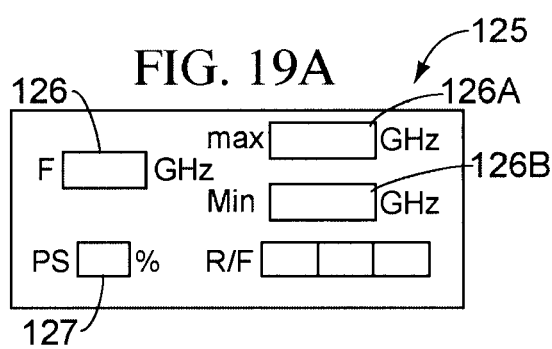
Figure 19D:
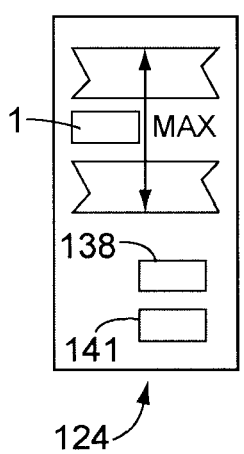
Figure 19E:
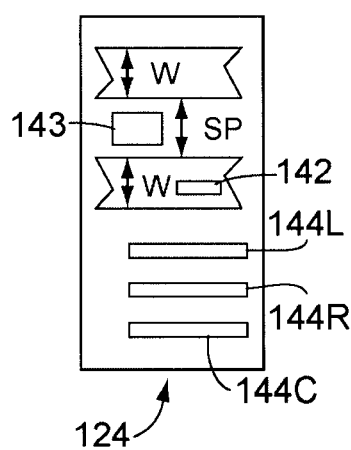
Figure 19B:
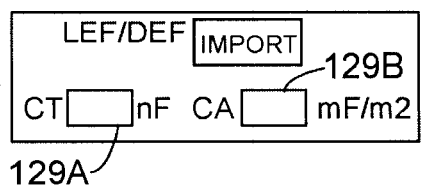
Figure 19F:
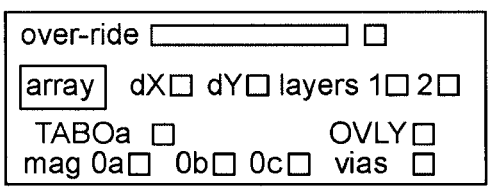
Figure 19C:
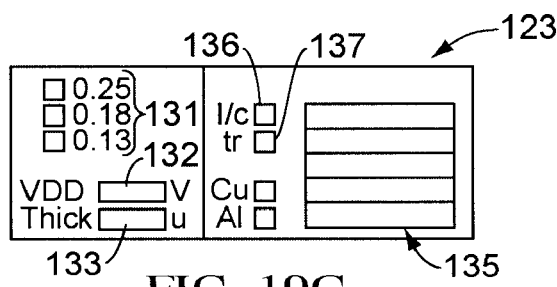

FIGS. 19A–C show a norm for the "specify" screen, typically at the areas 125, 124 and 123, respectively. Top left will thus be (FIG. 19A) for the set or target operating frequency at 126, including capability to set a maximum/minimum range at 126A, B; also for showing the phase spread (127) as a % representing skew tolerance, and setting (128) the rise/fall time of the desired timing signals whether such as by quick/faster/fastest or as a figure of merit typically in picoseconds. Bottom left will be (FIG. 19B) for total capacitance of all loads involved (129) and for capacitance per unit area (129A). Bottom left will be (FIG. 19C) for intended or target technology as to feature size (131), logic operating voltage (132), and in metallisation layer thickness 20 (133) and type (134); together with foundry selectables (135) for which stored data will be pulled out into the display, whether for interconnects (136) or for transistors (137).

FIG. 19D is relevant to the "constrain" screen, specifically to setting and displaying parameters of the conductive traces of the transmission-line endless rotary signal paths of the RTW component circuits, see as to minimum width 138, maximum overall width 139, and proportion (141) of the metallisation layer to be available to the clock. As a norm, this can be the only content of the constrain screen; but more may be imported as desired by the user.

FIG. 19E is relevant to the "solve" screen, and will normally be at bottom 30 left (124) with the array display occupying the majority of the screen from the right hand side, say all of areas 122 and 123. This includes width (142) and spacing (143) of the transmission line traces, also inductance (144L), capacitance (144C) and resistance (144R) per unit length This solve screen is likely to have the most "tearoff" items, often including call-ups for detail concerning loads, connect lines, array geometry, waveform preview, skew tolerance, etc; and include capability to look at and adjust at least its projected power consumption as well as adjusting the transmission line traces. This is, of course, all in the interests of user inter-action in moving from a failing or poor projected layout to a viable or better one, and the "solve" screen is intended mainly for expert users.

The "simulate" screen will have a choice between waveform and a normally mouse-operated user-probable representation of the RTW array so that it can be inspected for waveform at any array or individual circuit position, and will usually carry analysed waveform data concerning frequency, skew, jitter etc.

FIG. 19F relates to the "worst case" screen, and can show detail of the transmission line trace connections, and/or of the transmission lines on either layer of metallisation, etc, including with magnification capabilities to aid assessment in what is adjudged to be the worst case for any part of the RTW array and/or its context of operation The "circuits" screen is also intended for expert users, and will show a circuit diagram for the regenerative back-to-back diode circuitry cross-connecting the transmission line traces as specifically taught and shown in the above UK patent, including equivalent trace inductance, capacitance and resistance elements complete with parameter values and capabilities for further investigation of capacitance parameters, intrinsic gate resistance, drain inductance parasitics, supply parasitics, decoupling, varactors etc; and call-up for such as FastHenry analysis.

The CAD-related teaching hereof also extends inventively to measures further aiding reviewing and specifying detail of the regenerative cross-connection circuitry indicated in FIGS. 11 and 12 as blocks 141, though without showing their related via connections to the dual conductor traces concerned. The parameter-indicating back-to-back inverter circuit diagram mentioned in relation to the "solve" screen and shown at 131 in FIG. 20 is further useful in the innovative detail review and adjustment now being described. Indeed, this cross-connection circuitry is preferably of a highly configurable nature, see FIG. 21, not only as to its inverters 142, but also as to affording but also as to configuration of associated pass transistors that will usually comprise both P- and N-types; and /or further for such as varactors 143 capable of fine timing signal operating frequency adjustment of up to about +/−10%, and/or of capacitors 144 capable of medium such frequency adjustment of up to about +/−25% and/or maybe even frequency dividers (not shown) for coarse frequency adjustment All of these configurable inverter, pass transistor, varactor and capacitor provisions 142-145 are indicated diagrammatically as of three-stage type, see dashed dividers, and further as said three stages being of a binary weighted nature, see 10 one-two- and four-times width spacing of the dashed dividers, and control lines thereto from bus 146. It will be appreciated that binary signals from the bus 146 onto the control lines can specify maxima up to seven times minima for standard binary weightings (though not require or limited thereto). The provisions 142-145 and the action of the control lines could be by bringing the related stage into operative effect 15 or by disabling it from operative effect.

This configurability can also be applied to padding capacitance capabilities that may then be in-built at least once per side path part of every endless RTW side path part, see 155A, B, C in FIG. 22 showing detail.

It is to be appreciated that in-built configuration capabilities of such regenerative cross-connection circuitry 141 and/or padding capacitance 151 afford very considerable adjustment capability to RTW timing signal array designers, including for automated software driven adjustment, but are also seen as having hardware aspects of invention.

Another feature with which the CAD provisions hereof can handle very readily indeed, perhaps particularly using the design verification routines already discussed at length, and further having specific hardware aspects of invention, is any requirement or desire for parts of layers carrying the dual-conductors of the endless RTW signal paths to be left free, whether for other usage or as being pointless if registering with large-area functional logic such as 64-bit registers or memory etc, see at 161 in FIG. 23. As should be apparent from this Figure, all that is required is to ensure that the bounding dual-conductor parts of the endless RTW signal paths obey the impedance requirements for their junctions and do not disturb the re-circulatory transit time requirements. Resulting different impedance-matching widths of the dual-conductors are apparent.

FIG. 23 also indicates highly beneficial bounding of the whole array also 5 with impedance-matching dual-conductor parts.

Turning to inventive aspects of the RTW component circuit formation and arraying geometry as used in FIGS. 11, 12 and 23, same affords endless electromagnetically continuous signal paths of dual-conductor transmission-line nature with a signal inversion by way of a Moebius-twist type cross-over; and does so with particular merit for implementation using two layers of metallisation, as for semiconductor integrated circuits or double-sided or multi-layer printed circuit boards. In such context, and in general terms as another inventive aspect hereof, a nonintersecting plurality of dual conductors that cross another non-intersecting plurality of dual conductors with electrically insulating material between them has selective interconnections through the insulating material at crossing positions of the dual conductors of the two pluralities thereof, which selective interconnections are each one-to-one as between for the dual conductors of one said plurality and the dual conductors of the other said plurality, and, for crossing positions between which the dual conductors of one and the other said pluralities alternate in bounding at least one included area, the one-to-one interconnections are different from the others at one of the crossing positions associated with the or each said included area.

For the or each said included area, one of the dual conductors of each said plurality will be inner and the other outer (of the included area concerned), and there will be two different types of one-to-one interconnections, namely between inners and outers of both pluralities or between inner of one plurality and outer of the other.

A single inners-to-outers interconnection has the Moebius-twist effect (considering the dual conductors as edges of a strip). Two or any even number of such inter-connections negates the Moebius-twist, but any odd number preserves it.

For the alternation of dual conductors from one and the other said plurality about said included area, there will be four said crossing positions, for three of which the one-tone connection will be the same but different from the fourth. Any of the endless signal paths can share part of its path with part of another endless signal path so long as the signal rotations in each path have the same direction in the shared parts, so long as the equal power-in/power-out and related impedance implications are met for junctions at ends of the parts.

Where the dual conductors of each said plurality are parallel with those of one said plurality orthogonal to those of the other said plurality, as in rows and columns relationship, the included area will be rectangular with said interconnections at its four corners.

For rectangular RTW signal paths, i.e. with four corners available for the interconnections, the three-the-same-but-one-different requirement for the interconnections, and the preservation of the Moebius-twist effect by one or three inners-to-outers interconnections, combine to allow every included rectangle of a configuration of the pluralities of dual conductors in rows and columns to be an active RTW circuit.

FIG. 24 shows this by way of double-headed arrows indicating both of inners-to-outers interconnections and the included area of the signal path and RTW component circuit for which it has the Moebius-twist effect, but not for the row- or chain-adjacent RTW circuit.

The pitches between dual conductors of each plurality will determine the aspect ratio of the or each bounded rectangular area, thus the length of its boundary, which can be useful in relation to frequency requirements and numbers of RTW component circuits, and further useful in either having more of the dual conductors in one "layer" than in the other (as could suit for one IC metallisation layer being thicker than another) or in relation to the area occupied by the RTW component circuits (as could suit leaving one "layer" with less such occupancy).

Also as shown, it is noteworthy that vias for making the required interconnections exhibit pattern repetitions that are different for alternating rows 46 and alternating columns 47 in achieving the Moebius-twist effect for inner and outer conductive trace portions about each of the signal paths 45 with their via interconnections making a single continuous doubly circumscribing conductive trace.

These patterns of via pair connections in alternating rows are all the same in one, and successively opposite in the other; and same applies to alternating columns.

The invention claimed is:

1. A method to generate a design for timing circuitry that provides a traveling-wave type timing signal waveform along a path of transmission line nature, comprising:
   determining a plurality of regions of the timing circuitry, each region being sized such that a signal delay, along the path, between adjoining ones of such regions is below a particular fraction of a target operating frequency;
   generating a design for each of the determined regions of the timing circuitry such that, for each region individually, that region nominally has particular desired characteristics, the designs for the determined regions constituting an entire design;
   simulating operation of the entire design;
   selectively adjusting the design for at least some of the regions based on a result of the simulating step; and
   repeating the steps of simulating and selectively adjusting as appropriate until the result of the simulating step is a desired result.

2. The method of claim 1, wherein the step of determining a plurality of regions includes:
   for each region,
      dividing perimeters of each region into a number of segments;
      approximating lumped transmission line LCR for at least some of the segments; and
      determining relevant parameters such that time delays over each segment have a particular relationship to a function of the target frequency and the number of segments for the perimeter of that region.

3. The method of claim 2, wherein the function of the target frequency and the number of segments for the perimeter of that region is the target frequency divided by twice the number of segments.

4. The method of claim 3, wherein the particular relationship is substantial equality.

5. The method of claim 1,
   wherein the timing circuitry includes regenerative means distributed along the path to control voltage transitions in the timing signal waveform; and
   wherein step the step of determining a plurality of regions includes, for each region,
      dividing perimeters of each region into segments; and
      determining a lumped capacitance of each segment to be substantially equal to a worst case load capacitance plus loop-to-loop interconnect capacitance plus active delay capacitance of the regenerative means.

6. The method of claim 2, wherein the step of determining a plurality of regions further includes, for unloaded segments, determining a padding capacitance to substantially match the capacitance of the lumped line capacitance.

* * * * *